United States Patent
Lee et al.

(10) Patent No.: US 11,417,699 B2
(45) Date of Patent: Aug. 16, 2022

(54) IMAGE SENSOR AND METHOD OF FABRICATING THE SAME

(71) Applicant: SAMSUNG ELECTRONICS CO., LTD., Suwon-si (KR)

(72) Inventors: Kwang-Min Lee, Seoul (KR); Doo Won Kwon, Seongnam-si (KR); Seok Jin Kwon, Seoul (KR); Kyoung Won Na, Seoul (KR); In Gyu Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 16/826,455

(22) Filed: Mar. 23, 2020

(65) Prior Publication Data
US 2021/0057478 A1    Feb. 25, 2021

(30) Foreign Application Priority Data
Aug. 20, 2019   (KR) .......................... 10-2019-0101623

(51) Int. Cl.
*H01L 27/146* (2006.01)
(52) U.S. Cl.
CPC .... *H01L 27/14636* (2013.01); *H01L 27/1469* (2013.01); *H01L 27/14605* (2013.01)
(58) Field of Classification Search
CPC ...................... H01L 27/14636; H01L 27/1469
See application file for complete search history.

(56) References Cited

U.S. PATENT DOCUMENTS

| | | | | |
|---|---|---|---|---|
| 7,714,403 B2* | 5/2010 | Lee | ................... | H01L 27/14632 257/457 |
| 9,312,295 B2* | 4/2016 | Terada | .............. | H01L 27/14618 |
| 9,780,136 B2 | 10/2017 | Kwon | | |
| 9,972,603 B2 | 5/2018 | Chu et al. | | |
| 10,199,355 B2 | 2/2019 | Kim et al. | | |
| 10,276,619 B2 | 4/2019 | Kao et al. | | |
| 10,741,607 B2* | 8/2020 | Yoon | ................... | H01L 21/6835 |
| 11,244,981 B2* | 2/2022 | Huang | .............. | H01L 27/14636 |
| 2018/0158859 A1* | 6/2018 | Takahashi | ......... | H01L 27/14636 |
| 2018/0240835 A1* | 8/2018 | Wu | ................... | H01L 27/14636 |

(Continued)

FOREIGN PATENT DOCUMENTS

CN    108172589 A    6/2018

*Primary Examiner* — David A Zarneke
(74) *Attorney, Agent, or Firm* — Sughrue Mion, PLLC

(57) ABSTRACT

An image sensor includes a substrate, first and second insulating structures, a first wiring structure, a through via, and first and second connection patterns. The substrate includes a sensor array region and a pad region. The first insulating structure is disposed on a second surface of the substrate. The first wiring structure is formed in the first insulating structure and includes first conductive layers and first vias. The through via passes through the substrate in the pad region and connects to the first wiring structure. The first connection pattern is connected to the first wiring structure. The second insulating structure is disposed on a fourth surface of the first insulating structure. The second connection pattern is connected to the first connection pattern. The first conductive layers include a first wiring, and a second wiring spaced farther from the substrate than the first wiring. The through via contacts the second wiring.

20 Claims, 30 Drawing Sheets

(56) References Cited

U.S. PATENT DOCUMENTS

| | | |
|---|---|---|
| 2019/0103425 A1 | 4/2019 | Yoon et al. |
| 2019/0189668 A1* | 6/2019 | Park .................... H01L 27/1469 |
| 2019/0198552 A1* | 6/2019 | Park .................... H01L 23/5226 |
| 2021/0028218 A1* | 1/2021 | Zhang ............... H01L 27/14629 |

* cited by examiner

IMAGE SENSOR AND METHOD OF FABRICATING THE SAME

CROSS-REFERENCE TO RELATED APPLICATION

This application claims priority from Korean Patent Application No. 10-2019-0101623, filed on Aug. 20, 2019, in the Korean Intellectual Property Office, the disclosure of which is incorporated by reference herein in its entirety.

BACKGROUND

1. Field

The present disclosure relates to an image sensor and a method of fabricating the same, and more particularly, to an image sensor including a pad region and a method of fabricating the image sensor.

2. Description of the Related Art

An image sensor is one of the semiconductor devices that converts optical information into an electrical signal. Such image sensors may include charge coupled device (CCD) image sensors and complementary metal-oxide semiconductor (CMOS) image sensors.

Recently, research has been conducted on a backside illumination (BSI) image sensor on which light is incident through a back side of a semiconductor substrate in order to improve the light reception efficiency and light sensitivity of pixels formed in the image sensor.

SUMMARY

It is an aspect to provide an image sensor having improved performance by shorting a path of an electrical signal in a pad region.

It is another aspect to provide a method of fabricating an image sensor having improved performance by shorting a path of an electrical signal in a pad region.

According to an aspect of an embodiment, there is provided an image sensor comprising, a substrate which comprises a sensor array region and a pad region disposed around the sensor array region and comprises a first surface and a second surface opposite each other, a first insulating structure which is disposed on the second surface of the substrate and comprises a third surface facing the second surface and a fourth surface opposite the third surface, a first wiring structure which is formed in the first insulating structure and comprises a plurality of first conductive layers and a plurality of first vias, a through via which passes through the substrate in the pad region and is connected to the first wiring structure, a first connection pattern which is exposed from the fourth surface of the first insulating structure and connected to the first wiring structure, a second insulating structure which is disposed on the fourth surface of the first insulating structure and a second connection pattern which is exposed from a surface of the second insulating structure and connected to the first connection pattern, wherein the first conductive layers comprise a first wiring and a second wiring spaced farther from the substrate than the first wiring, and the through via contacts the second wiring.

According to another aspect of an embodiment, there is provided an image sensor comprising, a substrate which comprises a photoelectric conversion layer and comprises a first surface on which light is incident and a second surface opposite the first surface, a conductive pad which is disposed on the first surface of the substrate, a first insulating structure which is disposed on the second surface of the substrate and comprises a third surface facing the second surface and a fourth surface opposite the third surface, a first wiring which is formed in the first insulating structure and comprises a first opening, a second wiring which is formed in the first insulating structure and spaced farther from the substrate than the first wiring, a through via which passes through the substrate and the first opening to connect the conductive pad and the second wiring, a first connection pattern which is exposed from the fourth surface of the first insulating structure and connected to the second wiring, a second insulating structure which is disposed on the fourth surface of the first insulating structure and a second connection pattern which is exposed from a surface of the second insulating structure and connected to the first connection pattern.

According to another aspect of an embodiment, there is provided an image sensor comprising, a first substrate which comprises a sensor array region and a pad region disposed around the sensor array region and comprises a first surface on which light is incident and a second surface opposite the first surface, a color filter which is disposed on the first surface of the first substrate in the sensor array region, a microlens which is disposed on the color filter, a conductive pad which is disposed on the first surface of the first substrate in the pad region, a first insulating structure which is disposed on the second surface of the substrate and comprises a third surface facing the second surface and a fourth surface opposite the third surface, a first wiring structure which is formed in the first insulating structure and comprises a plurality of first conductive layers and a plurality of first vias, the plurality of first conductive layers including a first wiring, a first through via which passes through the first substrate in the pad region to connect the conductive pad and the first wiring structure, a first connection pattern which is exposed from the fourth surface of the first insulating structure and connected to the first wiring structure, a second insulating structure which is disposed on the fourth surface of the first insulating structure, a second wiring structure which is formed in the second insulating structure and comprises a plurality of second conductive layers and a plurality of second vias and a second connection pattern which is exposed from a surface of the second insulating structure and connects the first connection pattern and the second wiring structure, wherein the first through via does not contact the first wiring which is closest to the first substrate among the first conductive layers.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Image sensors according to embodiments will now be described with reference to FIGS. 1 through 22.

Figure 1:
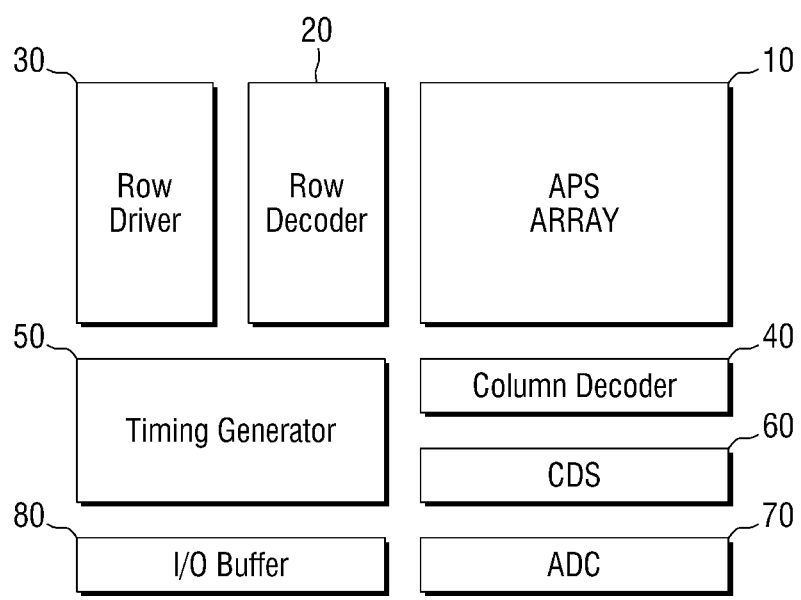
FIG. 1 is a schematic block diagram of an image sensor according to embodiments.

FIG. 1 is a schematic block diagram of an image sensor according to embodiments.

Referring to FIG. 1, the image sensor according to various embodiments includes an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The APS array 10 may include a plurality of unit pixels arranged in two dimensions and may convert optical signals into electrical signals. The APS array 10 may be driven by a plurality of driving signals such as a pixel selection signal, a reset signal, and a charge transfer signal received from the row driver 30. In addition, the electrical signals output from the APS array 10 may be provided to the CDS 60.

The row driver 30 may provide a plurality of driving signals for driving a plurality of unit pixels of the APS array 10 according to the decoding result of the row decoder 20. When the unit pixels are arranged in a matrix, the driving signals may be provided to each row.

The timing generator 50 may provide a timing signal and a control signal to the row decoder 20 and the column decoder 40.

The CDS 60 may receive the electrical signals generated by the APS array 10 and hold and sample the received electrical signals. The CDS 60 may double-sample a specific noise level and signal levels of the electrical signals and output difference levels between the noise level and the signal levels.

The ADC 70 may convert analog signals corresponding to the difference levels output from the CDS 60 into digital signals and output the digital signals.

The I/O buffer 80 may latch the digital signals and sequentially output the latched signals to an image signal processor (not illustrated) according to the decoding result of the column decoder 40.

Figure 2:
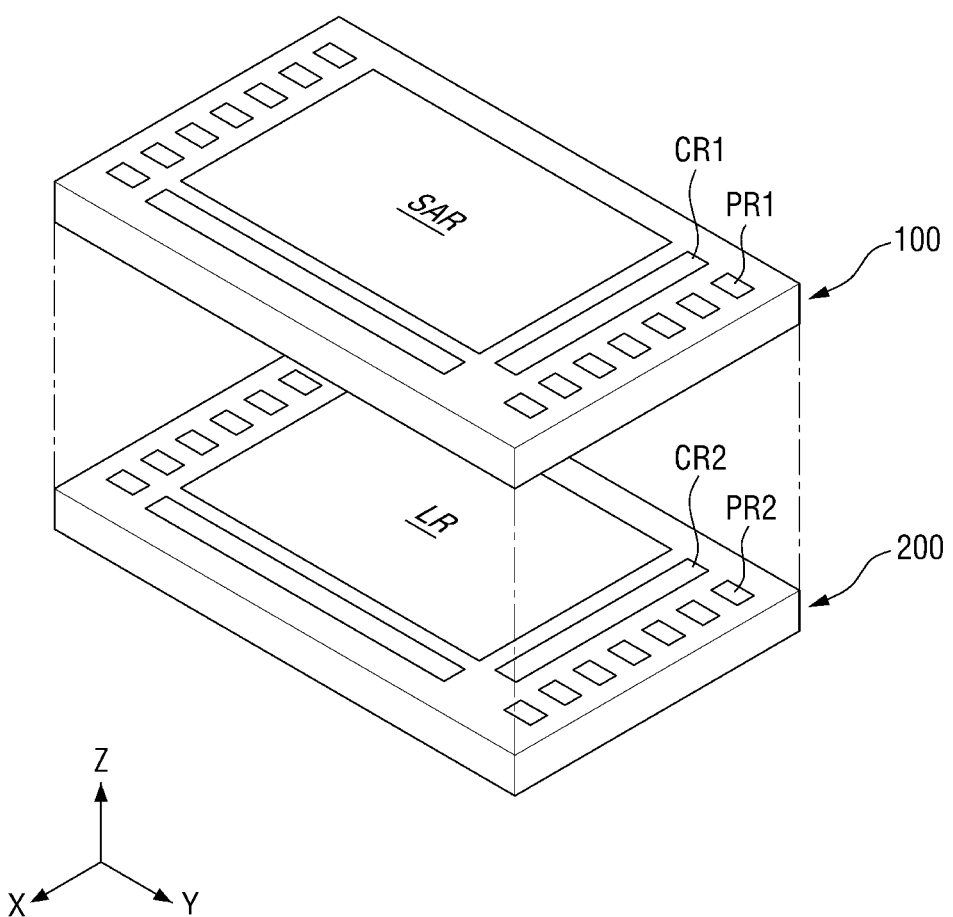
FIG. 2 is a schematic layout view of the image sensor according to the embodiments.

FIG. 2 is a schematic layout view of the image sensor according to embodiments.

Referring to FIG. 2, the image sensor according to various embodiments may include a first stacked structure 100 and a second stacked structure 200.

The first stacked structure 100 may be stacked on the second stacked structure 200. In some embodiments, the first stacked structure 100 may include a sensor array region SAR, a first connection region CR1, and a first pad region PR1.

The sensor array region SAR may include a region corresponding to the APS array 10 of FIG. 1. For example, the sensor array region SAR may include a plurality of unit pixels arranged in two dimensions (e.g., in a matrix) in a plane including a first direction X and a second direction Y. Each of the unit pixels may include a photoelectric conversion layer. This will be described in detail later with reference to FIGS. 3 through 5.

The first connection region CR1 may be disposed around the sensor array region SAR. The first connection region CR1 may electrically connect the sensor array region SAR of the first stacked structure 100 to the second stacked structure 200. This will be described in detail later with reference to FIG. 3.

The first pad region PR1 may be disposed around the sensor array region SAR. In the first pad region PR1, conductive pads may be formed. The conductive pads may be connected to an external device and be configured to transmit and receive electrical signals between the external device and the image sensor according to the embodiments. This will be described in detail later with reference to FIGS. 3 and 6 through 9.

The arrangement of the first connection region CR1 and the first pad region PR1 in FIG. 2 is merely an example, and the technical spirit of the present disclosure is not limited to this example.

In some embodiments, the second stacked structure 200 may include a logic circuit region LR, a second connection region CR2, and a second pad region PR2.

A plurality of electronic devices may be formed in the logic circuit region LR. The electronic devices may include, for example, transistors. The logic circuit region LR may be electrically connected to the sensor array region SAR and may transmit and receive an electrical signal to and from each unit pixel of the sensor array region SAR. For example, the logic circuit region LR may include regions corresponding to the row decoder 20, the row driver 30, the column decoder 40, the timing generator 50, the CDS 60, the ADC 70, and the I/O buffer 80 of FIG. 1.

The second connection region CR2 may be disposed around the logic circuit region LR. The second connection region CR2 may electrically connect the logic circuit region LR of the second stacked structure 200 to the first stacked structure 100. Accordingly, the sensor array region SAR may be electrically connected to the logic circuit region LR and may transmit and receive electrical signals to and from the logic circuit region LR. The second connection region CR2 may be formed in a region of the second stacked structure 200 which corresponds to the first connection region CR1, but embodiments are not limited to this case.

The second pad region PR2 may be disposed around the logic circuit region LR. The second pad region PR2 may be electrically connected to the first pad region PR1. The second pad region PR2 may be formed in a region of the second stacked structure 200 which corresponds to the first pad region PR1, but embodiments are not limited to this case. Each of the first pad region PR1 and the second pad region PR2 may include a plurality of pads.

Figure 3:
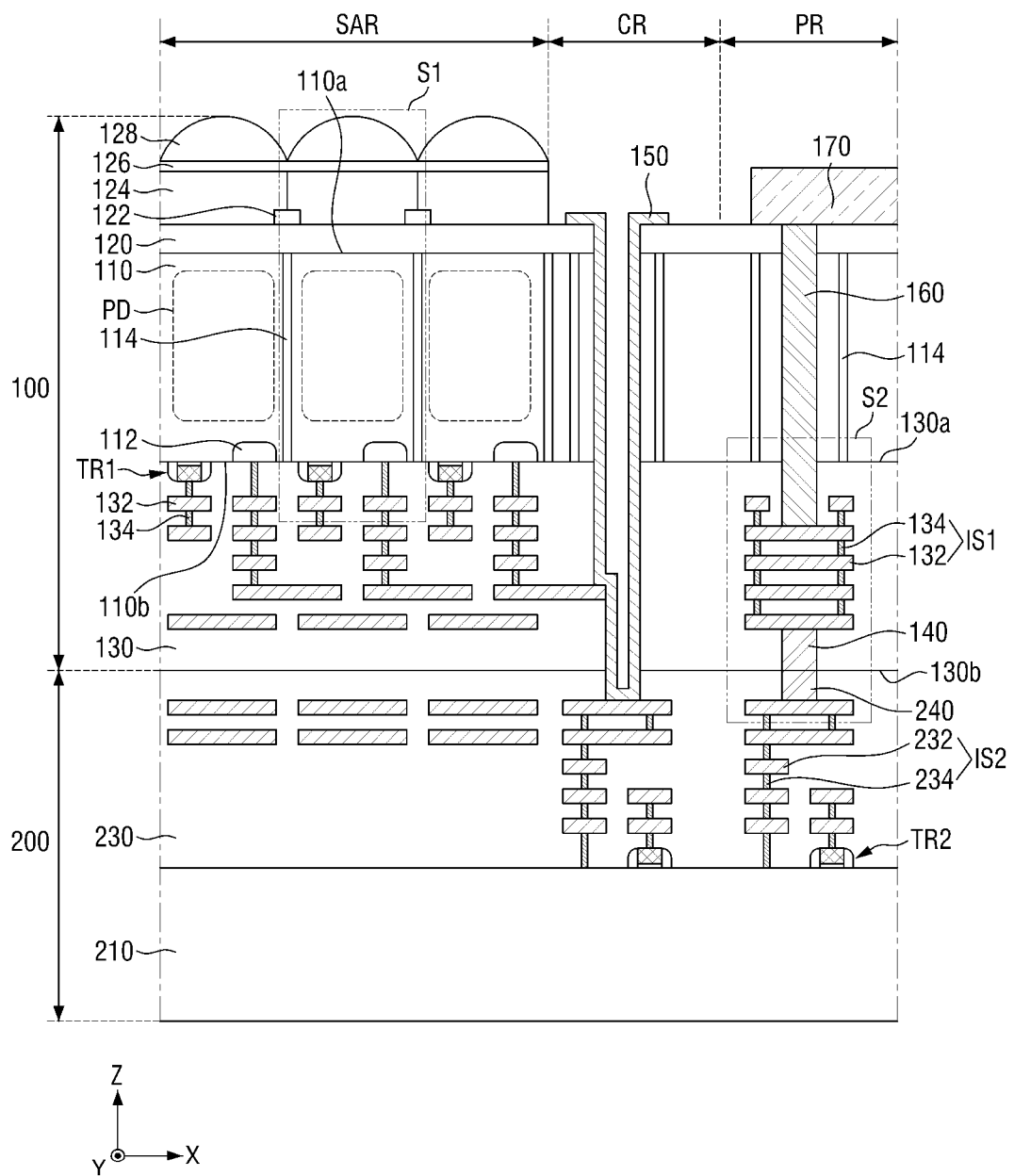
FIG. 3 is a schematic cross-sectional view of an image sensor according to embodiments.
Figure 4:
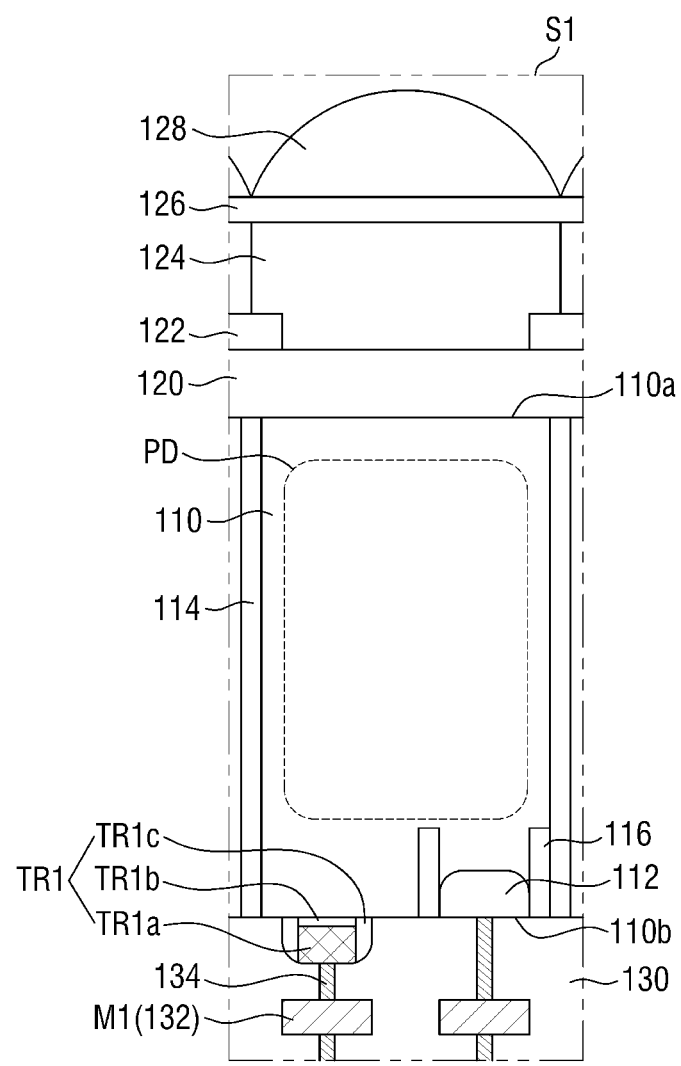
FIG. 4 is an enlarged view of a region S1 of the image sensor of FIG. 3.
Figure 5:
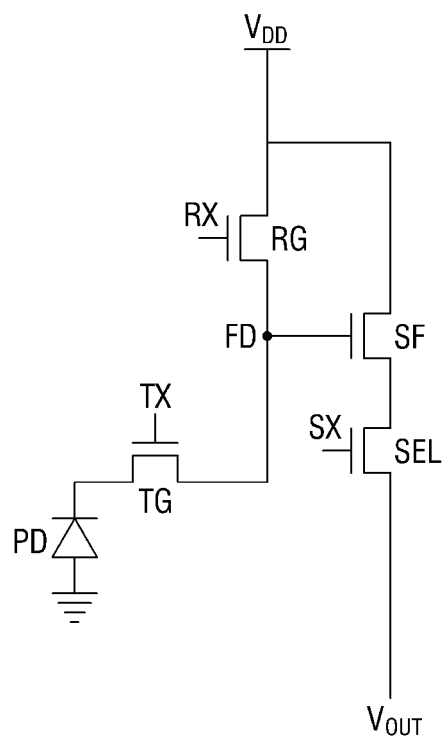
FIG. 5 is an example circuit diagram of a unit pixel illustrated in the region S1 of FIG. 4.
Figure 6:
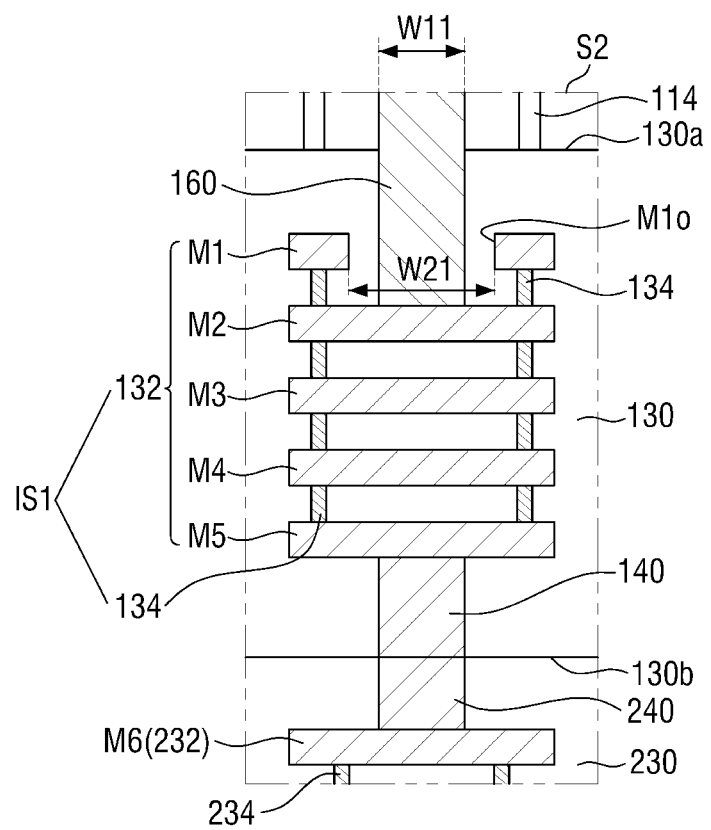
FIGS. 6 through 8 are various enlarged views of a region S2 of the image sensor of FIG. 3, according to embodiments.
Figure 7:
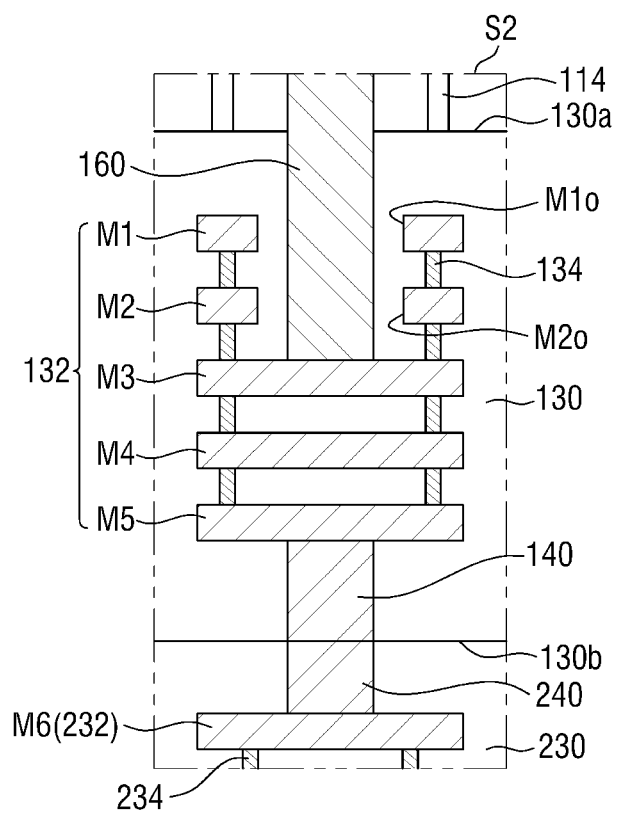
Figure 8:
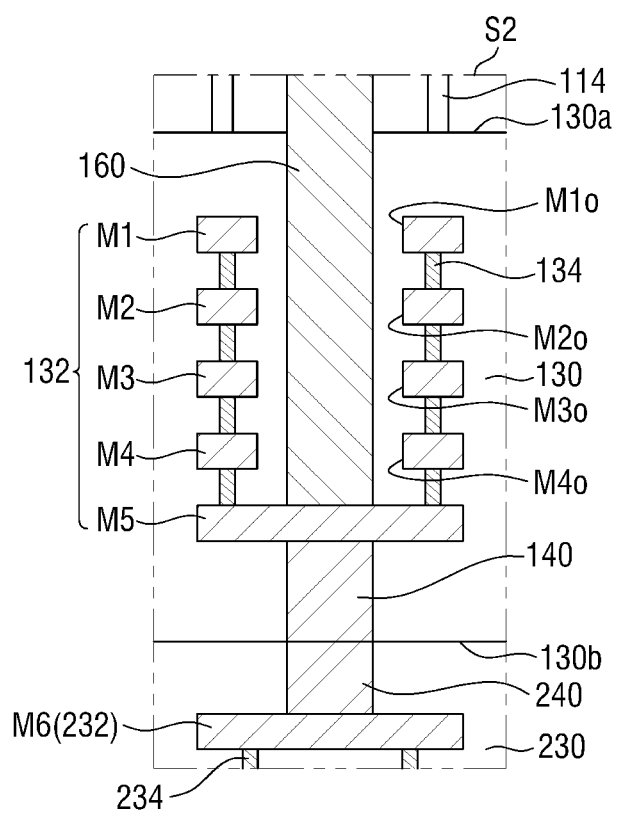
Figure 9:
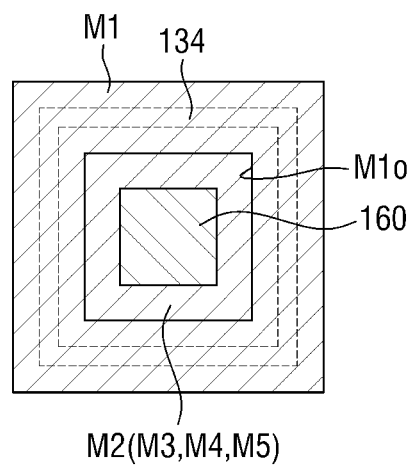
FIG. 9 is a layout view of a first wiring structure and a first through via illustrated in the region S2 of FIGS. 6 through 8.

FIG. 3 is a schematic cross-sectional view of an image sensor according to embodiments. FIG. 4 is an enlarged view of a region S1 of the image sensor of FIG. 3. FIG. 5 is an example circuit diagram of a unit pixel illustrated in the region S1 of FIG. 4. FIGS. 6 through 8 are various enlarged views of a region S2 of the image sensor of FIG. 3. FIG. 9 is a layout view of a first wiring structure and a first through via illustrated in FIGS. 6 through 8. For ease of description, a description of elements and features described above using FIGS. 1 and 2 will be given only briefly or omitted for conciseness.

Referring to FIGS. 3 through 9, the image sensor according to various embodiments includes a first substrate 110, a first insulating structure 130, the first wiring structure IS1, a first connection pattern 140, a first through via 160, a conductive pad 170, a second substrate 210, a second insulating structure 230, a second wiring structure IS2, and a second connection pattern 240.

In some embodiments, the first substrate 110 and the first insulating structure 130 may constitute a first stacked structure 100, and the second substrate 210 and the second insulating structure 230 may constitute a second stacked structure 200. A sensor array region SAR of the first stacked structure 100 may correspond to the sensor array region SAR of FIG. 2. Connection regions CR of the first stacked structure 100 and the second stacked structure 200 may correspond to the first connection region CR1 and the second connection region CR2, respectively, of FIG. 2. Pad regions PR of the first stacked structure 100 and the second stacked structure 200 may correspond to the first pad region PR1 and the second pad region PR2, respectively, of FIG. 2.

The first substrate 110 may include a first surface 110a and a second surface 110b which are opposite each other (see, e.g., FIG. 4). In some embodiments, the first surface 110a of the first substrate 110 may be a light receiving surface on which light is incident. The first substrate 110 may be a semiconductor substrate. For example, the first substrate 110 may be bulk silicon or silicon-on-insulator (SOI). The first substrate 110 may be a silicon substrate or a substrate made of another material such as silicon germanium, indium antimonide, lead telluride, indium arsenide, indium phosphide, gallium arsenide, or gallium antimonide. Alternatively, the first substrate 110 may include a base substrate and an epitaxial layer formed on the base substrate.

The first substrate 110 in the sensor array region SAR may form a plurality of unit pixels. For example, as illustrated in FIG. 4, each of the unit pixels may include a photoelectric conversion layer PD, an active region 112, a first transistor TR1, a first device isolation layer 114, a second device isolation layer 116, a first planarization layer 120, a color filter 124, grid patterns 122, a second planarization layer 126, and a microlens 128.

The photoelectric conversion layer PD may be formed in the first substrate 110 in the sensor array region SAR. The photoelectric conversion layer PD may generate charges in proportion to the amount of light incident from the outside.

The photoelectric conversion layer PD may include, but is not limited to, a photodiode, a phototransistor, a photogate, a pinned photodiode, an organic photodiode, quantum dots, or a combination of the same.

The active region 112 may be formed in the first substrate 110 under the second surface 110b. The active region 112 may be formed by, for example, doping the first substrate 110 with impurities. The active region 112 may form various active regions of each unit pixel. For example, the active region 112 may form a floating diffusion region FD of FIG. 5 to be described later or source/drain regions of various transistors TG, RG, SF and SEL of FIG. 5.

The first transistor TR1 may be formed on the second surface 110b of the first substrate 110. The first transistor TR1 may be connected to the photoelectric conversion layer PD to form various transistors for processing electrical signals. For example, the first transistor TR1 may form various transistors TG, RG, SF and SEL of FIG. 5 which will be described later.

In some embodiments, the first transistor TR1 may be a metal oxide semiconductor (MOS) transistor. For example, the first transistor TR1 may include a gate electrode TR1a, a gate dielectric layer TR1b, and gate spacers TR1c. The gate dielectric layer TR1b may be interposed between the gate electrode TR1a and the first substrate 110. The gate spacers TR1c may extend along side surfaces of the gate electrode TR1a.

The first device isolation layer 114 may define each unit pixel in the sensor array region SAR. For example, the first device isolation layer 114 may surround each unit pixel. The first device isolation layer 114 may be formed by filling an insulating material in a deep trench formed by patterning the first substrate 110. For example, the first device isolation layer 114 may extend from the first surface 110a to the second surface 110b. Depending on the patterning process, the first device isolation layer 114 may have a width that varies from the first surface 110a toward the second surface 110b (e.g., in a third direction Z).

In some embodiments, the first device isolation layer 114 may include an insulating material having a refractive index lower than that of the first substrate 110. For example, when the first substrate 110 is made of silicon, the first device isolation layer 114 may include a silicon oxide layer, a silicon nitride layer, an undoped polysilicon layer, air, or a combination of the same. Accordingly, the first device isolation layer 114 may refract light obliquely incident on the photoelectric conversion layer PD. In addition, the first device isolation layer 114 may prevent charges generated in a specific pixel by incident light from moving to adjacent pixel regions due to random drift. That is, the first device isolation layer 114 may improve the quality of image data by increasing a light reception rate of the photoelectric conversion layer PD.

The second device isolation layer 116 may define the active region 112 in each unit pixel. For example, the second device isolation layer 116 may be formed in the first substrate 110 under the second surface 110b. The second device isolation layer 116 may define a region, in which the second device isolation layer 116 is not formed, as the active region 112.

The second device isolation layer 116 may be formed by filling an insulating material in a shallow trench formed by patterning the first substrate 110. For example, a depth to which the second device isolation layer 116 is formed may be smaller than a depth to which the first device isolation layer 114 is formed.

The first planarization layer 120 may be formed on the first surface 110a of the first substrate 110. The first planarization layer 120 may cover the first surface 110a of the first substrate 110. The first planarization layer 120 may include an insulating material. For example, the first planarization layer 120 may include silicon oxide.

The color filter 124 may be formed on the first planarization layer 120 in the sensor array region SAR. The color filter 124 may correspond to each unit pixel. For example, the color filters 124 may be arranged in two dimensions (e.g., in a matrix) in a plane including the first direction X and the second direction Y.

The color filter 124 may be a red, green or blue color filter according to a unit pixel to which the color filter 124 corresponds. Alternatively, the color filters 124 may include a yellow filter, a magenta filter, and a cyan filter. Alternatively, the color filters 124 may further include a white filter.

The grid patterns 122 may be formed in a lattice shape on the first surface 110a of the first substrate 110. For example, the grid patterns 122 may be formed on the first planarization layer 120 and interposed between the color filters 124. The grid patterns 122 may reflect light obliquely incident on the first substrate 110, thereby providing more incident light to the photoelectric conversion layer PD.

The second planarization layer 126 may be formed on the color filter 124. The second planarization layer 126 may cover the color filter 124. The second planarization layer 126 may include an insulating material. For example, the second planarization layer 126 may include silicon oxide.

The microlens 128 may be disposed on the second planarization layer 126. The microlens 128 may correspond to each unit pixel. For example, the microlenses 128 may be arranged in two dimensions (e.g., in a matrix) in a plane including the first direction X and the second direction Y.

The microlens 128 may be convex and may have a predetermined radius of curvature. Accordingly, the microlens 128 may concentrate incident light on the photoelectric conversion layer PD. The microlens 128 may include, for example, a light transmitting resin.

Each unit pixel in the sensor array region SAR may receive light and convert an optical signal into an electrical signal. For example, as illustrated in FIG. 5, each unit pixel in the sensor array region SAR may include a photoelectric conversion layer PD, a transfer transistor TG, a floating diffusion region FD, a reset transistor RG, a source follower transistor SF, and a selection transistor SEL.

The photoelectric conversion layer PD may generate charges in proportion to the amount of light incident from the outside. The photoelectric conversion layer PD may be coupled to the transfer transistor TG which transfers the generated and accumulated charges to the floating diffusion region FD. The floating diffusion region FD is a region that converts charges into a voltage and may cumulatively store charges due to its parasitic capacitance.

An end (i.e., a source or drain) of the transfer transistor TG may be connected to the photoelectric conversion layer PD, and the other end (i.e, a source or drain) of the transfer transistor TG may be connected to the floating diffusion region FD. The transfer transistor TG may be formed as a transistor driven by a predetermined bias (e.g., a transfer signal TX). That is, the transfer transistor TG may transfer charges generated by the photoelectric conversion layer PD to the floating diffusion region FD according to the transfer signal TX.

The source follower transistor SF may amplify a change in an electric potential of the floating diffusion region FD which receives charges from the photoelectric conversion layer PD and may output the amplified change to an output line $V_{out}$. When the source follower transistor SF is turned on, a predetermined electric potential provided to a drain of the source follower transistor SF, for example, a power supply voltage $V_{DD}$ may be transferred to a drain region of the selection transistor SEL.

The selection transistor SEL may select unit pixels to be read on a row-by-row basis. The selection transistor SEL may be a transistor driven by a selection line which applies a predetermined bias (e.g., a row selection signal SX).

The reset transistor RG may periodically reset the floating diffusion region FD. The reset transistor RG may be a transistor driven by a reset line which applies a predetermined bias (e.g., a reset signal RX). When the reset transistor RG is turned on by the reset signal RX, a predetermined electric potential provided to a drain of the reset transistor RG, for example, the power supply voltage $V_{DD}$ may be transferred to the floating diffusion region FD.

Referring again to FIG. 3, the first insulating structure 130 may be formed on the second surface 110b of the first substrate 110. The first insulating structure 130 may cover the second surface 110b of the first substrate 110. For example, the first insulating structure 130 may include a third surface 130a and a fourth surface 130b which are opposite each other (see, e.g., FIG. 6). Here, the third surface 130a of the first insulating structure 130 may face the second surface 110b of the first substrate 110. The first insulating structure 130 may be composed of one layer or a plurality of layers.

The first insulating layer 130 may include an insulating material. For example, the first insulating structure 130 may include at least one of silicon oxide, silicon nitride, silicon oxynitride, or a low-k material having a lower dielectric constant than silicon oxide.

The first wiring structure IS1 may be formed on the second surface 110b of the first substrate 110. For example, the first wiring structure IS1 may be formed in the first insulating structure 130. The first wiring structure IS1 may include a plurality of first conductive layers 132 and a plurality of first vias 134. The number and arrangement of the first conductive layers 132 and the number and arrangement of the first vias 134 in FIG. 3 are merely an example, and embodiments are not limited to this example.

The first conductive layers 132 may be formed in a multilayer structure. Each of the first conductive layers 132 may extend along a plane including, e.g., the first direction X and the second direction Y.

For example, as illustrated in FIG. 6, the first conductive layers 132 may include a first wiring M1, a second wiring M2, a third wiring M3, a fourth wiring M4, and a fifth wiring M5 sequentially stacked from the first surface 110a of the first substrate 110. That is, the first through fifth wirings M1 through M5 may be gradually spaced apart from the first substrate 110 in this order. In the following description, for example, the first wiring M1 will be described as a conductive layer closest to the first substrate 110 among the first conductive layers 132, and the fifth wiring M5 will be described as a conductive layer farthest from the first substrate 110 among the first conductive layers 132.

The first vias 134 may connect the first conductive layers 132 to each other. Each of the first vias 134 may extend, for example, along the third direction Z to electrically connect the first conductive layers 132. Each of the first vias 134 may have various pillar shapes such as a cylinder, a truncated cone, a polygonal pillar, or a truncated polygonal pyramid.

The first conducive layers 132 and the first vias 134 may include a conductive material. For example, the first conductive layers 132 and the first vias 134 may include at least one of tungsten (W), copper (Cu), aluminum (Al), gold (Au), silver (Ag), or alloys of the same.

In some embodiments, a plurality of pixel regions in the sensor array region SAR may be electrically connected to the first wiring structure IS1 in the sensor array region SAR. For example, as illustrated in FIGS. 3 and 4, the active regions 112 and/or the first transistors TR1 may be connected to the first conductive layers 132 through the first vias 134. The first vias 134 may contact the active regions 112 or the gate electrodes TR1a of the first transistors TR1.

The first connection pattern 140 may be connected to the first wiring structure IS1. For example, the first connection pattern 140 may be connected to a bottom surface of a first conductive layer 132. The first connection pattern 140 may be exposed from a surface of the first insulating structure 130. For example, the first connection pattern 140 may extend along the third direction Z to be exposed from the fourth surface 130b of the first insulating structure 130. The first connection pattern 140 may have various pillar shapes such as a cylinder, a truncated cone, a polygonal pillar, or a truncated polygonal pyramid.

The first connection pattern 140 may include a conductive material. The first connection pattern 140 may include, for example, copper (Cu).

In some embodiments, the first connection pattern 140 may contact the conductive layer spaced farthest from the first substrate 110 among the first conductive layers 132. For example, as illustrated in FIG. 6, the first connection pattern 140 may contact the fifth wiring M5.

The first through via 160 may be formed in the pad region PR. The first through via 160 may pass through the first substrate 110 in the pad region PR and may be connected to the first wiring structure IS1. For example, the first through via 160 may extend along the third direction Z to be connected to an upper surface of a first conductive layer 132. The first through via 160 may have various pillar shapes such as a cylinder, a truncated cone, a polygonal pillar, or a truncated polygonal pyramid.

The first through via 160 may include a conductive material. For example, the first through via 160 may include at least one of tungsten (W), copper (Cu), aluminum (Al), gold (Au), silver (Ag), or alloys of the same.

In some embodiments, the first through via 160 may contact a conductive layer spaced farther from the first substrate 110 than the conductive layer closest to the first substrate 110 among the first conductive layers 132. For example, as illustrated in FIG. 6, the first through via 160 may contact the second wiring M2 spaced farther from the first substrate 110 than the first wiring M1. In the following description, a first conductive layer 132 which contacts the first through via 160 may be referred to as a "landing pad." For example, in FIG. 6, the second wiring M2 may be referred to as the landing pad.

In some embodiments, the first wiring M1 may surround a first conductive layer 132 in plan view. For example, as illustrated in FIGS. 6 and 9, the first wiring M1 may include a first opening M1o. The first through via 160 may pass through the first opening M1o to contact the second wiring M2. Although the first opening M1o is illustrated as being square in FIG. 9, this is merely an example. For example, the first opening M1o may also have a circular shape or other polygonal shapes.

In some embodiments, a first via 134 connecting the first wiring M1 and the second wiring M2 may surround a first conductive layer 132. For example, as illustrated in FIG. 9, the first via 134 may surround side surfaces of the first through via 160 in a similar shape to the first wiring M1.

In some embodiments, the first through via 160 may not contact the first wiring M1. For example, as illustrated in FIG. 6, a width W11 of the first through via 160 may be smaller than a width W21 of the first opening M1o. Here, the term "width" denotes a width in the first direction X (or the second direction Y). Accordingly, the first through via 160 may pass through the first wiring M1 to contact the second wiring M2.

In some embodiments, the first device isolation layer 114 in the first substrate 110 may be formed on the side surfaces of the first through via 160. For example, the first device isolation layer 114 formed in the pad region PR may surround the side surfaces of the first through via 160. In some embodiments, the first device isolation layer 114 formed in the pad region PR may be spaced apart from the side surfaces of the first through via 160. The first device isolation layer 114 may electrically isolate the first through via 160 in the first substrate 110.

In some embodiments, the first through via 160 may contact a first conductive layer 132 spaced farther from the first substrate 110 than the second wiring M2. For example, as illustrated in FIG. 7, the first through via 160 may contact the third wiring M3. That is, in FIG. 7, the third wiring M3 may be a landing pad.

In some embodiments, the second wiring M2 may surround a first conductive layer 132 in plan view. For example, as illustrated in FIGS. 7 and 9, the second wiring M2 may include a second opening M2o. The first through via 160 may pass through the first opening M1o and the second opening M2o to contact the third wiring M3.

In some embodiments, the first through via 160 may contact the first conductive layer 132 spaced farthest from the first substrate 110 among the first conductive layers 132. For example, as illustrated in FIG. 8, the first through via 160 may contact the fifth wiring M5. That is, in FIG. 8, the fifth wiring M5 may be a landing pad.

In some embodiments, the first through fourth wirings M1 through M4 may surround a first conductive layer 132 in plan view. For example, as illustrated in FIGS. 8 and 9, the third wring M3 may include a third opening M3o, and the fourth wiring M4 may include a fourth opening M4o. The first through via 160 may pass through the first through fourth openings M1o through M4o to contact the fifth wiring M5.

Referring again to FIG. 3, the conductive pad 170 may be formed in the pad region PR. In addition, the conductive pad 170 may be formed on the first surface 110a of the first substrate 110. For example, the conductive pad 170 may be formed and exposed on the first planarization layer 120. The conductive pad 170 may be connected to the first through via 160. For example, the first through via 160 may pass through the first substrate 110 and the first planarization layer 120 and may be connected to a bottom surface of the conductive pad 170.

The conductive pad 170 may include a conductive material. The conductive pad 170 may include, for example, at least one of tungsten (W), copper (Cu), aluminum (Al), gold (Au), silver (Ag), or alloys of the same. The conductive pad 170 may be connected to an external device and configured to transmit and receive electrical signals between the external device and the image sensor according to the embodiments.

The second substrate 210 may be bulk silicon or SOI. The second substrate 210 may be a silicon substrate or a substrate made of another material such as silicon germanium, indium antimonide, lead telluride, indium arsenide, indium phosphide, gallium arsenide, or gallium antimonide. Alternatively, the second substrate 210 may include a base substrate and an epitaxial layer formed on the base substrate.

A plurality of electronic devices may be formed on the second substrate 210. For example, second transistors TR2 may be formed on the second substrate 210. The second transistors TR2 may constitute, for example, the logic circuit region LR of FIG. 2.

The second insulating structure 230 may be formed on the second substrate 210. The second insulating structure 230 may cover the second substrate 210. The second insulating structure 230 may be attached to the first insulating structure 130. For example, the second insulating structure 230 may be formed and attached onto the fourth surface 130b of the first insulating structure 130. The second insulating structure 230 may include one layer or a plurality of layers.

The second insulating structure 230 may include an insulating material. For example, the second insulating structure 230 may include at least one of silicon oxide, silicon nitride, silicon oxynitride, or a low-k material having a lower dielectric constant than silicon oxide. In some embodiments, the second insulating structure 230 may include the same material as the first insulating structure 130.

The second wiring structure IS2 may be formed on the fourth surface 130b of the first insulating structure 130. For example, the second wiring structure IS2 may be formed in the second insulating structure 230. The second wiring structure IS2 may include a plurality of second conductive layers 232 and a plurality of second vias 234. The number and arrangement of the second conductive layers 232 and the number and arrangement of the second vias 234 in FIG. 3 are merely an example, and embodiments are not limited to this example.

The second conductive layers 232 may be formed in a multilayer structure. Each of the second conductive layers 232 may extend along a plane including, e.g., the first direction X and the second direction Y.

The second vias 234 may connect the second conductive layers 232 to each other. Each of the second vias 234 may extend, for example, along the third direction Z to electrically connect the second conductive layers 232. Each of the second vias 234 may have various pillar shapes such as a cylinder, a truncated cone, a polygonal pillar, or a truncated polygonal pyramid.

The second conductive layers 232 and the second vias 234 may include a conductive material. For example, the second conductive layers 232 and the second vias 234 may include at least one of tungsten (W), copper (Cu), aluminum (Al), gold (Au), silver (Ag), or alloys of the same.

In some embodiments, the second transistors TR2 may be electrically connected to the second wiring structure IS2. For example, as illustrated in FIGS. 3 and 4, the second transistors TR2 may be connected to the second conductive layers 232 through the second vias 234.

In some embodiments, the first wiring structure IS1 in the sensor array region SAR may be electrically connected to the second wiring structure IS2 in the connection region CR. For example, as illustrated in FIG. 3, the first wiring structure IS1 in the sensor array region SAR may be connected to the second wiring structure IS2 in the connection region CR through a second through via 150.

The second through via 150 may be formed in the connection region CR. The second through via 150 may pass through the first substrate 110 in the connection region CR to connect the first wiring structure IS1 and the second wiring structure IS2. For example, the second through via 150 may extend along the third direction Z to connect a first conductive layer 132 in the connection region CR and a second conductive layer 232 in the connection region CR. Accordingly, the second transistor TR2 may be electrically connected to the sensor array region SAR and transmit and receive an electrical signal to and from each unit pixel of the sensor array region SAR.

Although the second through via 150 extends conformally in the drawing, this is merely an example. For example, the second through via 150 may also have a pillar shape, like the first through via 160.

In some embodiments, the first device isolation layer 114 formed in the connection region CR may surround side surfaces of the second through via 150. In some embodiments, the first device isolation layer 114 formed in the connection region CR may be spaced apart from the side surfaces of the second through via 150. The first device isolation layer 114 may electrically isolate the second through via 150 in the first substrate 110.

The second connection pattern 240 may be connected to the second wiring structure IS2. For example, the second connection pattern 240 may be connected to an upper surface of a second conductive layer 232. The second connection pattern 240 may be exposed from a surface of the second insulating structure 230. The second connection pattern 240 may have various pillar shapes such as a cylinder, a truncated cone, a polygonal pillar, or a truncated polygonal pyramid.

In addition, the second connection pattern 240 may be connected to the first connection pattern 140. For example, a surface of the first connection pattern 140 exposed from the first insulating structure 130 and a surface of the second connection pattern 240 exposed from the second insulating structure 230 may contact each other. That is, the second connection pattern 240 may electrically connect the first connection pattern 140 and the second wiring structure IS2. Accordingly, the second wiring structure IS2 may be electrically connected to the conductive pads 170 in the pad region PR and transmit and receive electrical signals between the image sensor according to the embodiments and an external device.

The second connection pattern 240 may include a conductive material. The second connection pattern 240 may include, for example, copper (Cu). In some embodiments, the second connection pattern 240 may include the same material as the first connection pattern 140.

In some embodiments, the second connection pattern 240 may contact a conductive layer spaced farthest from the second substrate 210 among the second conductive layers 232. For example, as illustrated in FIG. 6, the second connection pattern 240 may contact a sixth wiring M6.

As image sensors become more highly integrated, the area of a unit pixel is increasingly reduced. In order to improve the sensitivity of an image sensor by compensating for the reduced area of a unit pixel, a thickness of a substrate including a photoelectric conversion layer and a thickness of a wiring structure for transmitting an electrical signal generated from the photoelectric conversion layer are increased. However, the increased thickness of the wiring structure increases a path along which an electrical signal is transmitted, thus causing a loss of a data signal or a power signal due to an IR drop.

However, the image sensor according to the embodiments shortens a path along which an electrical signal is transmitted by using the first through via 160. Thus, an image sensor with improved performance can be provided. For example, as described above, the first through via 160 may contact a conductive layer (e.g., the second wiring M2) spaced farther from the first substrate 110 than the first wiring M1 closest to the first substrate 110. Accordingly, a path of an electrical signal extending from the conductive pad 170 to the second wiring structure IS2 can be shortened, and an electrical signal of the pad region PR can be stably transmitted.

FIGS. 10 through 16 are various views illustrating first wiring structures and first through vias of image sensors according to embodiments. For ease of description, a description of elements and features described above using FIGS. 1 through 9 will be given briefly or omitted for conciseness. In FIGS. 10 through 16, a case where a landing pad is a second wiring M2 will be mainly described. However, it will be understood by those skilled in the art in light of the above description that the landing pad may also be one of the third through fifth wirings M3 through M5 in some cases.

Figure 10:
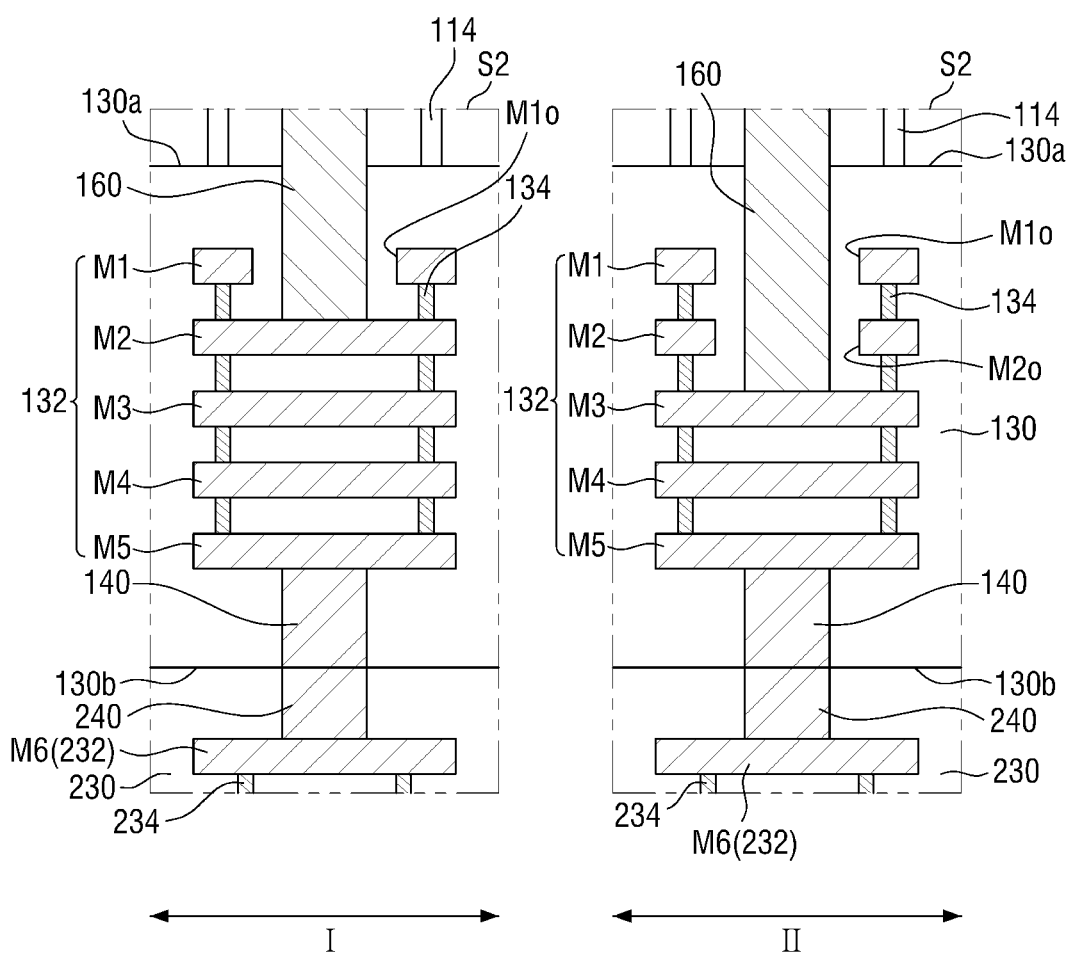
FIGS. 10 through 16 are various views illustrating first wiring structures and first through vias of image sensors according to embodiments.
Figure 10:
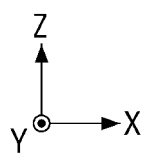

Referring to FIGS. 3 and 10, in an image sensor according to various embodiments, a pad region PR includes a first region I and a second region II.

The first region I and the second region II may be adjacent to each other or may be spaced apart from each other. In some embodiments, a first through via 160 formed in the first region I and a first through via 160 formed in the second region II may contact different conductive layers. That is, a landing pad of the first through via 160 in the first region I and a landing pad of the first through via 160 in the second region II may be different from each other.

For example, the first through via 160 formed in the first region I may contact a second wiring M2, and the first through via 160 formed in the second region II may contact a third wiring M3, as shown in FIG. 10.

Figure 11A:
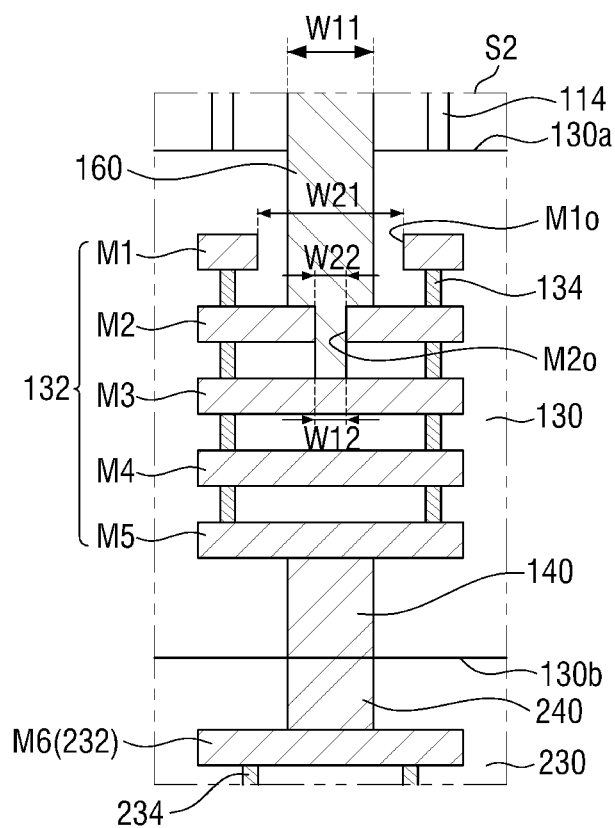
Figure 11B:
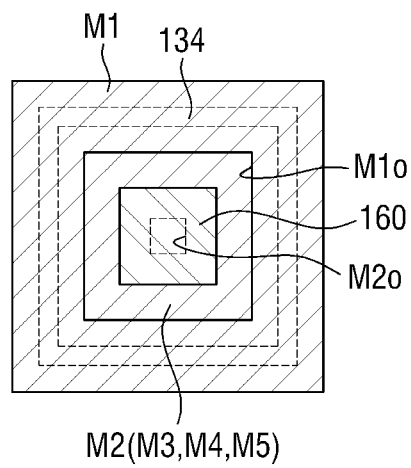

Referring to FIGS. 3, 11A and 11B, in an image sensor according to various embodiments, a first through via 160 may contact a plurality of first conductive layers 132. For reference, FIG. 11B is a layout view of a first wiring structure IS1 and the first through via 160 of FIG. 11A.

For example, the first through via 160 may contact a second wiring M2 and a third wiring M3.

In some embodiments, the first through via 160 may contact the second wiring M2, and the second wiring M2 may include a second opening M2o. The first through via 160 may pass through the second opening M2o of the second wiring M2 to contact the third wiring M3. Although the second opening M2o is illustrated as being square in FIG. 11B, this is merely an example. For example, the second opening M2o may also have a circular shape or other polygonal shapes.

In some embodiments, a width W11 of the first through via 160 which contacts an upper surface of the second wiring M2 may be greater than a width W12 of the first through via 160 which contacts an upper surface of the third wiring M3. In addition, in some embodiments, the width W12 of the first through via 160 which contacts the upper surface of the third wiring M3 may be the same as a width W22 of the second opening M2o. As used herein, the term "same" encompasses not only exactly the same but also encompasses a minute difference caused by a process margin or the like.

Since the first through via 160 contacts a plurality of first conductive layers 132, the electrical resistance between the first through via 160 and the first wiring structure IS1 may be reduced. Accordingly, the performance of the image sensor according to the embodiments may be improved.

Figure 12A:
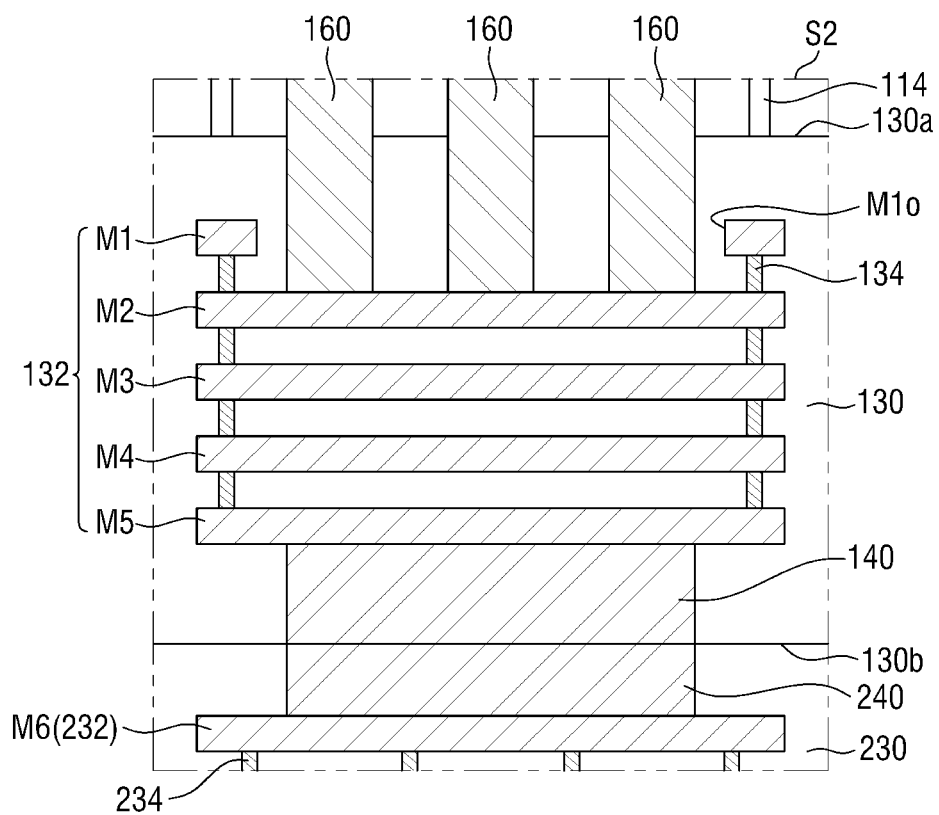
Figure 12B:
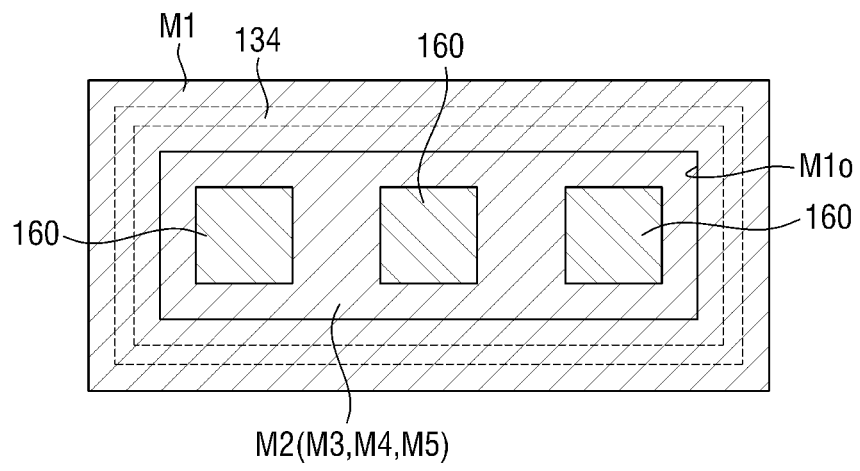

Referring to FIGS. 3, 12A and 12B, in an image sensor according to various embodiments, a plurality of first through vias 160 may be connected to a first conductive layer 132. For reference, FIG. 12B is a layout view of a first wiring structure IS1 and the first through vias 160 of FIG. 12A.

For example, the first through vias 160 spaced apart from each other may contact a second wiring M2. The number and arrangement of the first through vias 160 in FIGS. 12A and 12B are merely an example, and embodiments are not limited to this example.

In some embodiments, the first through vias 160 may be arranged in a line. For example, as illustrated, the first through vias 160 may be arranged along the first direction X.

Since the first through vias 160 contact a first conductive layer 132, the electrical resistance between the first through vias 160 and the first wiring structure IS1 may be reduced. Accordingly, the performance of the image sensor according to the embodiments may be improved.

Figure 13A:
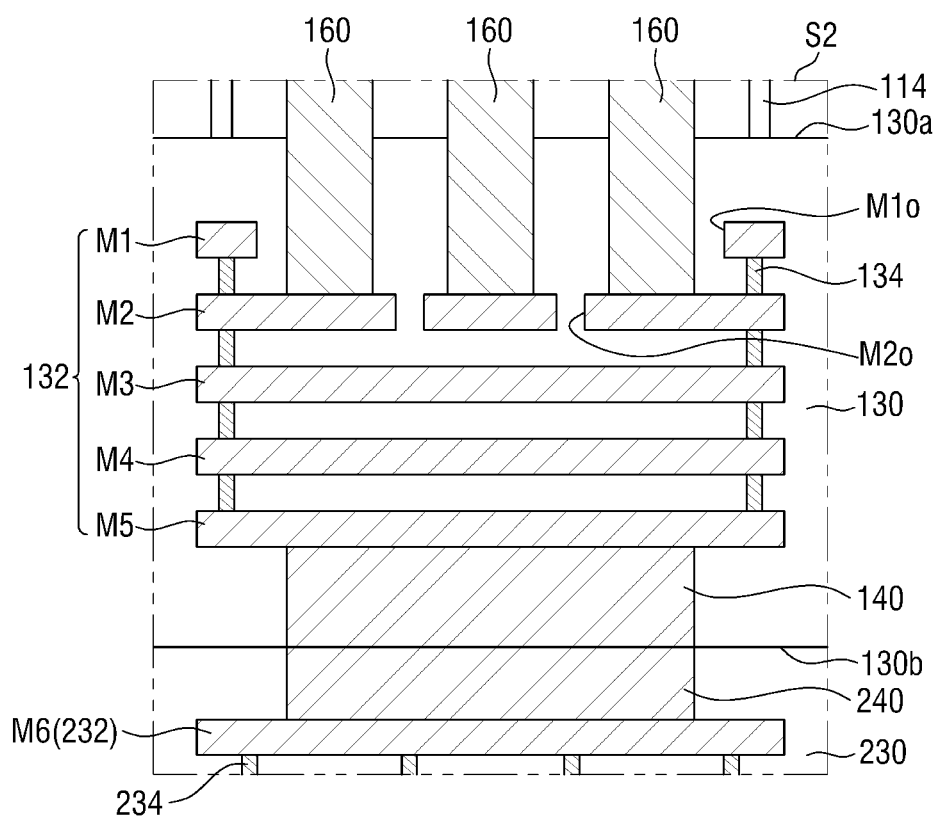
Figure 13B:
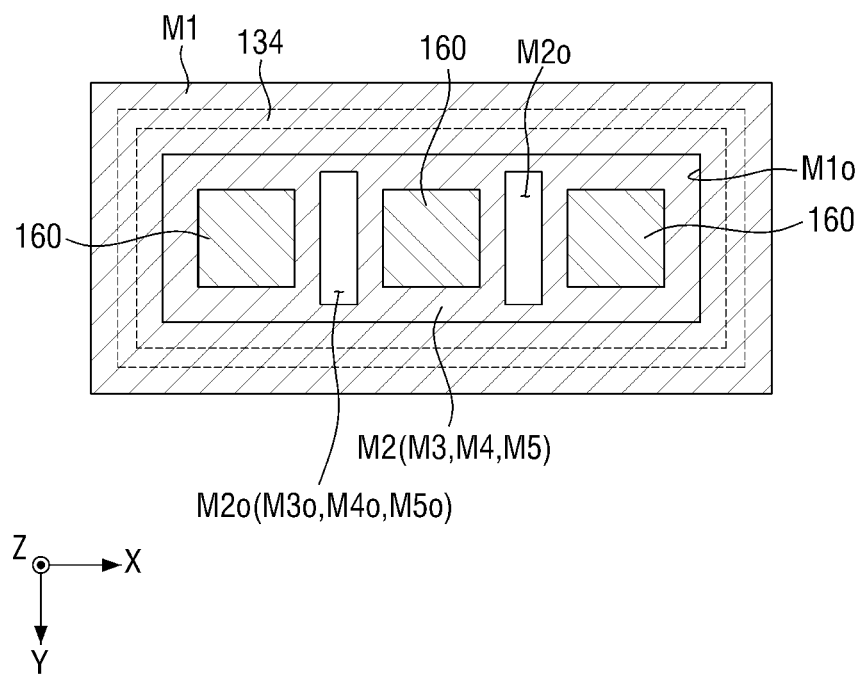

Referring to FIGS. 3, 13A and 13B, in an image sensor according to various embodiments, a landing pad may include a plurality of openings. For example, FIG. 13B is a layout view of a first wiring structure IS1 and first through vias 160 of FIG. 13A.

For example, the first through vias 160 may contact a second wiring M2. That is, the second wiring M2 may be a landing pad. Here, the second wiring M2 may include a plurality of second openings M2o.

In some embodiments, the second openings M2o may not overlap the first through vias 160 in plan view. For example, as illustrated in FIG. 13B, each of the second openings M2o may be interposed between the first through vias 160.

Since the landing pad includes a plurality of openings, a warpage phenomenon due to a difference in thermal expansion coefficient between the first through vias 160 and the first wiring structure IS1 may be improved. Accordingly, the reliability of the image sensor according to the embodiments may be improved.

Figure 14A:
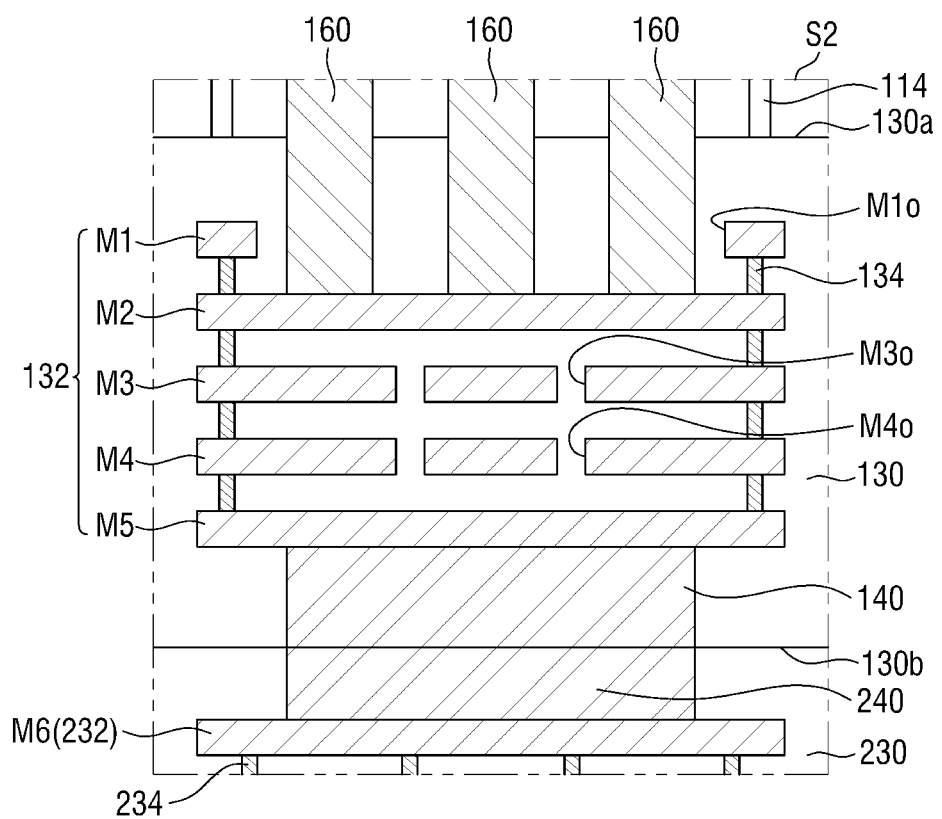
Figure 14B:
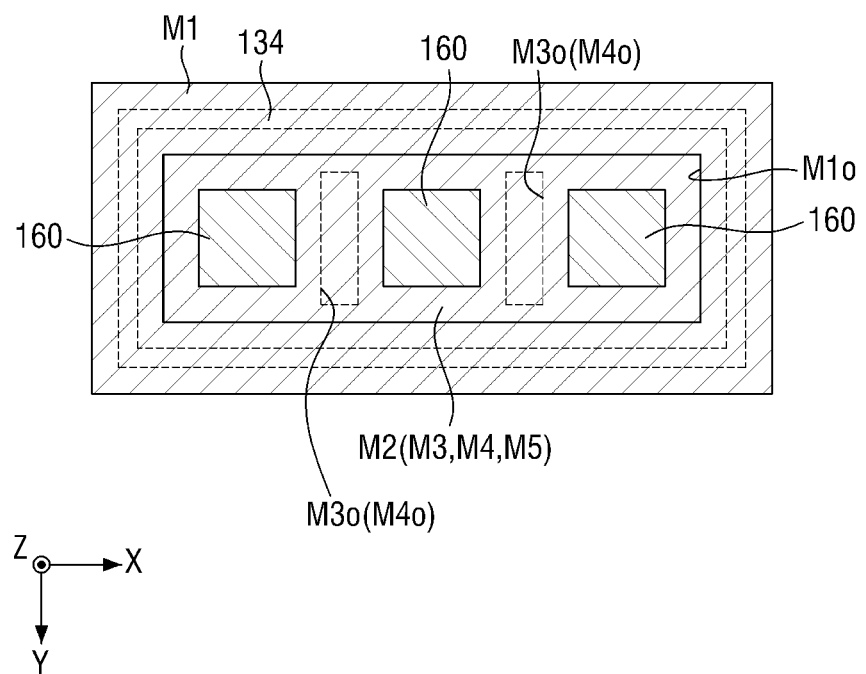

Referring to FIGS. 3, 14A and 14B, in an image sensor according to various embodiments, at least some of first conductive layers 132 which are not landing pads may include a plurality of openings. For reference, FIG. 14B is a layout view of a first wring structure IS1 and first through vias 160 of FIG. 14A.

For example, the first through vias 160 may contact a second wiring M2 and may not contact a third wiring M3 and a fourth wiring M4. That is, the second wiring M2 may be a landing pad, and the third wiring M3 and the fourth wiring M4 may not be landing pads. Here, the third wiring M3 may include a plurality of third openings M3o, and the fourth wiring M4 may include a plurality of fourth openings M4o.

In some embodiments, the second wiring M2 which contacts the first through vias 160 and a fifth wiring M5 which contacts a first connection pattern 140 may not include openings.

Since at least some of the first conductive layers 132 which are not landing pads include a plurality of openings, a warpage phenomenon due to a difference in thermal expansion coefficient between the first through vias 160 and the first wiring structure IS1 may be improved. Accordingly, the reliability of the image sensor according to the embodiments may be improved.

Figure 15:
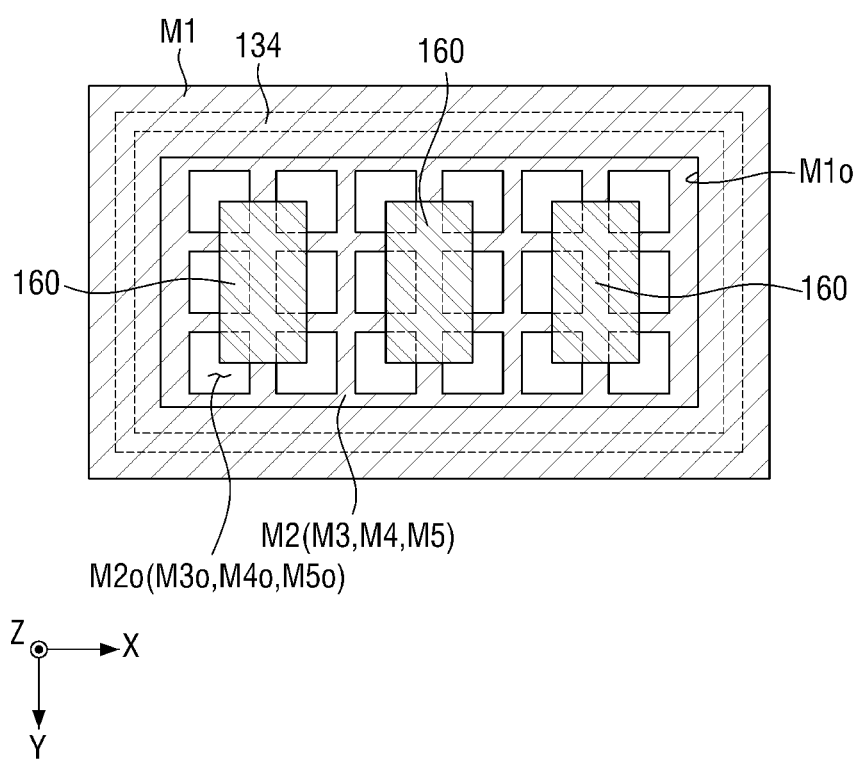

Referring to FIGS. 3 and 15, in an image sensor according to various embodiments, a plurality of openings may be arranged in a matrix.

For example, a second wiring M2 may include a plurality of second openings M2o. The second openings M2o may be arranged in a matrix in a plane including the first direction X and the second direction Y. Accordingly, the second wiring M2 may have a lattice shape in plan view. In some embodiments, the second wiring M2 may be a landing pad.

In some embodiments, the second openings M2o may at least partially overlap the first through vias 160 in plan view.

For example, as illustrated in FIG. 15, at least a part of each of the second openings M2o may overlap one of the first through vias 160.

Figure 16:
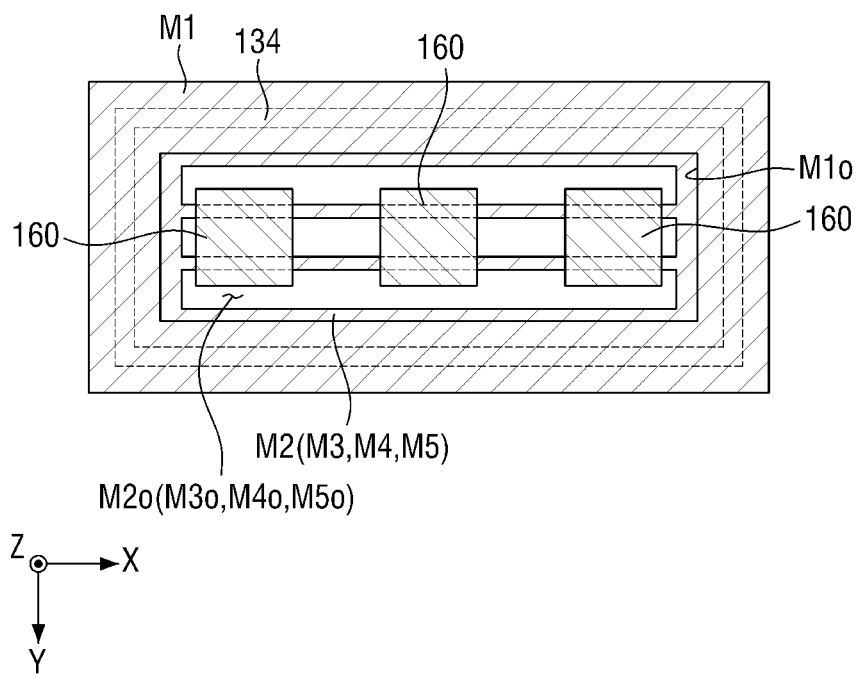

Referring to FIGS. 3 and 16, in an image sensor according to various embodiments, a plurality of openings may be in the shape of slits.

For example, a second wiring M2 may include a plurality of second openings M2o. Each of the second openings M2o may extend, for example, in the first direction X.

In some embodiments, each of the second openings M2o may extend in the same direction as a direction (e.g., the first direction X) in which a plurality of first through vias 160 are arranged.

Figure 17:
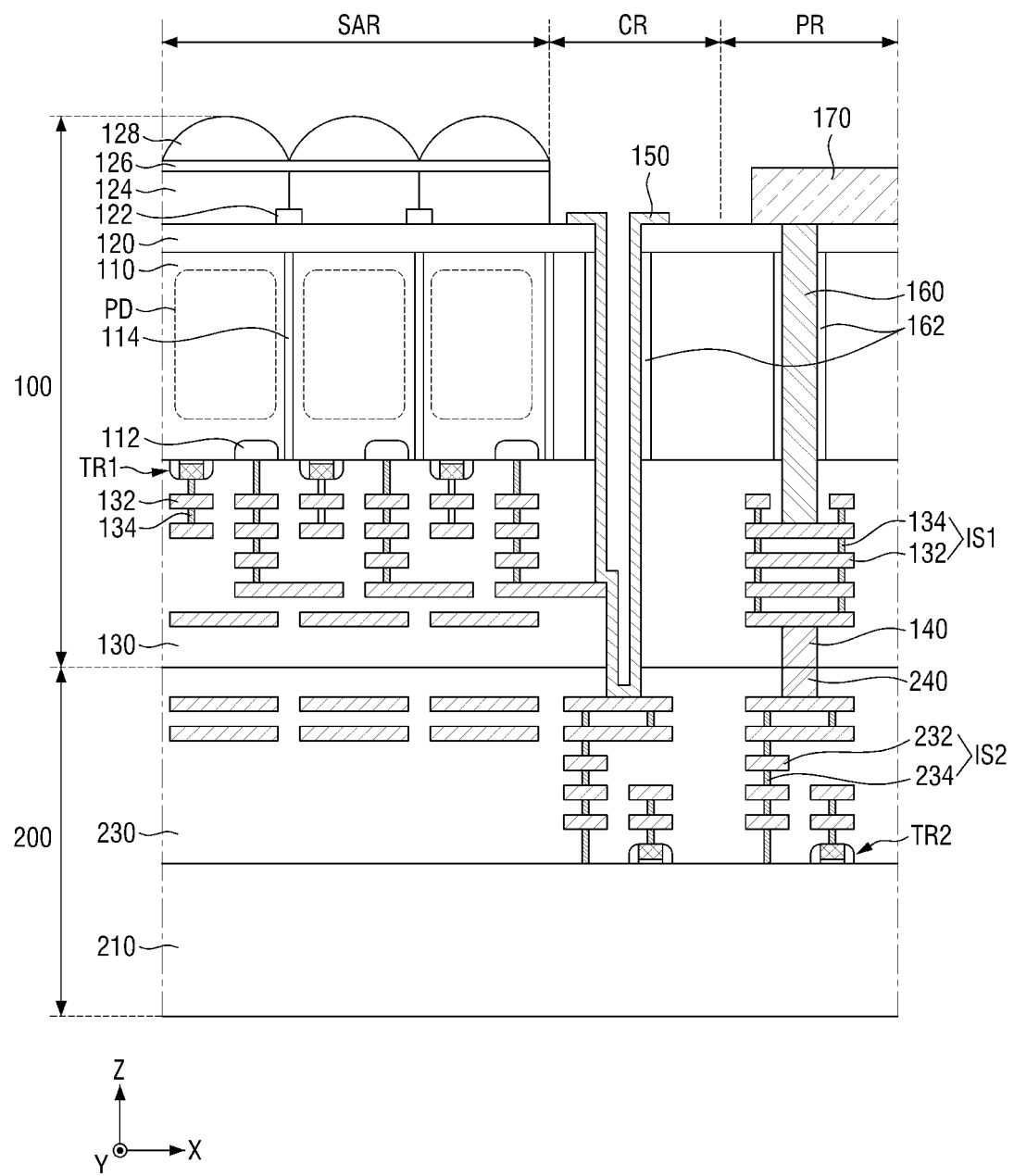
FIG. 17 is a schematic cross-sectional view of an image sensor according to embodiments.

FIG. 17 is a schematic cross-sectional view of an image sensor according to various embodiments. For ease of description, a description of elements and features described above using FIGS. 1 through 9 will be given briefly or omitted for conciseness.

Referring to FIG. 17, the image sensor according to various embodiments may further include insulating spacers 162.

The insulating spacers 162 may be formed on side surfaces of a first through via 160. For example, the insulating spacers 162 may extend along the side surfaces of the first through via 160. In some embodiments, the insulating spacers 162 may contact the side surfaces of the first through via 160. The insulating spacers 162 may electrically insulate the first through via 160 from a first substrate 110.

In some embodiments, the insulating spacers 162 may also be formed on side surfaces of a second through via 150. For example, the insulating spacers 162 may extend along the side surfaces of the second through via 150. In some embodiments, the insulating spacers 162 may contact the side surfaces of the second through vias 150. The insulating spacers 162 may electrically insulate the second through via 150 from the first substrate 110.

The insulating spacers 162 may include an insulating material. For example, the insulating spacers 162 may include at least one of silicon oxide, silicon nitride, silicon oxynitride, or a low-k material having a lower dielectric constant than silicon oxide.

Figure 18:
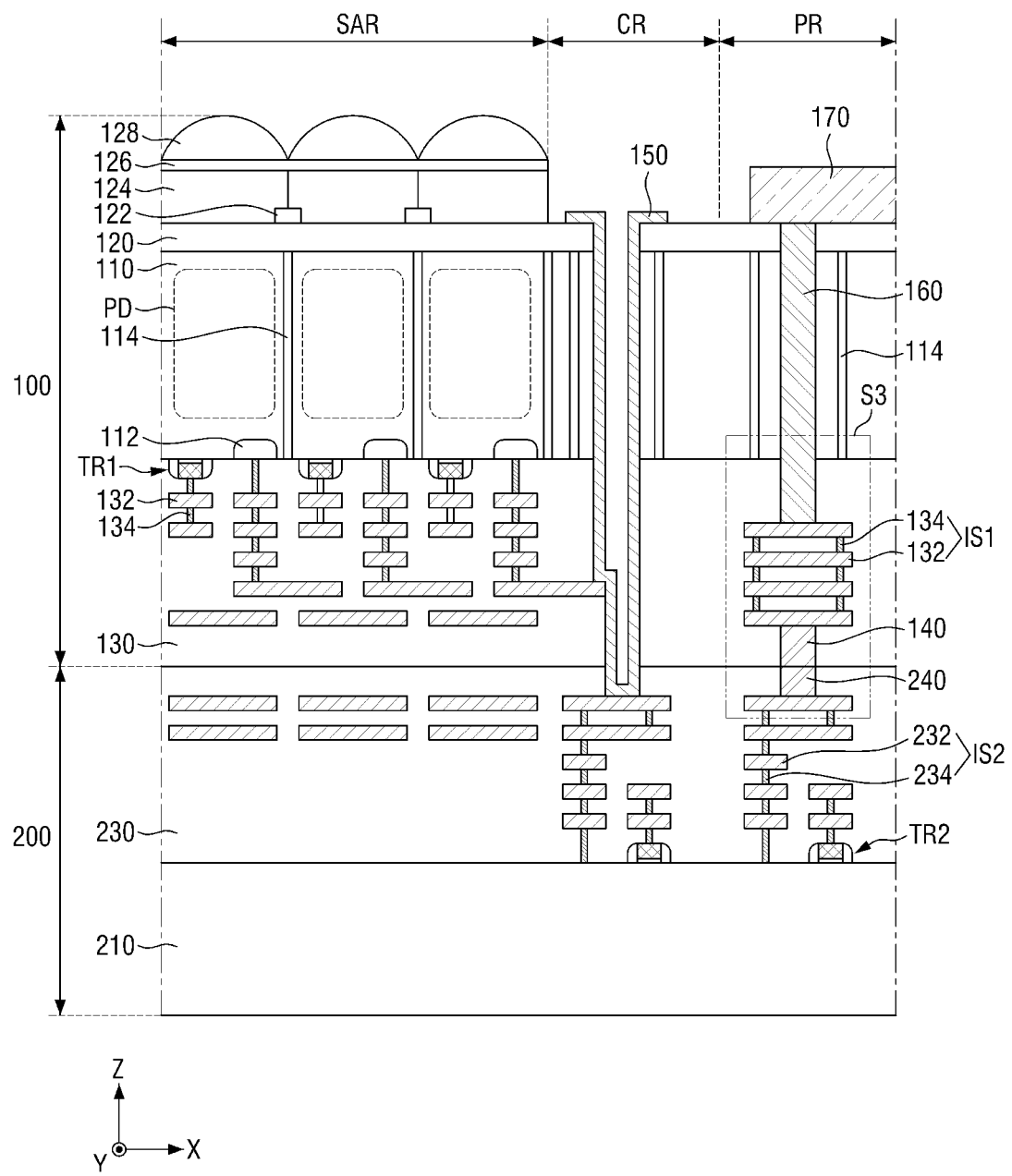
FIG. 18 is a schematic cross-sectional view of an image sensor according to embodiments.
Figure 19:
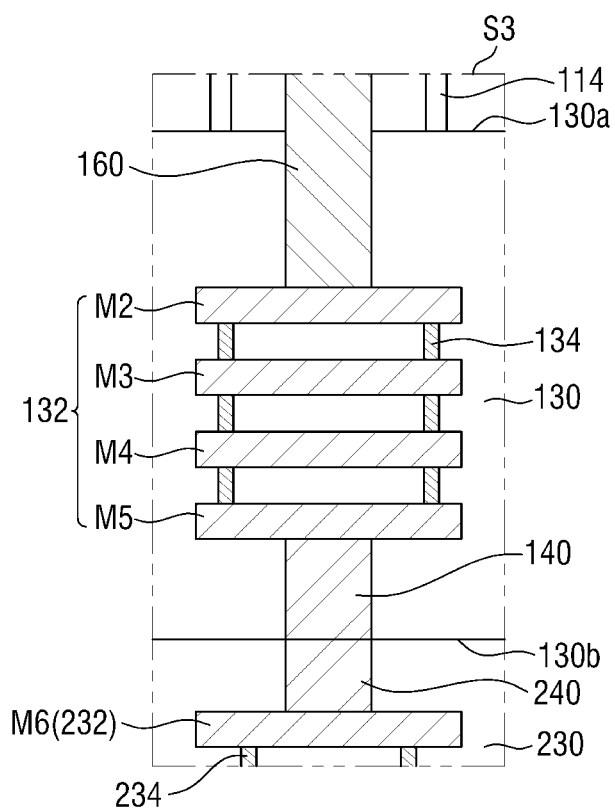
FIG. 19 is an enlarged view of a region S3 of the image sensor of FIG. 18.

FIG. 18 is a schematic cross-sectional view of an image sensor according to various embodiments. FIG. 19 is an enlarged view of region S3 of FIG. 18. For ease of description, a description of elements and features described above using FIGS. 1 through 9 will be given briefly or omitted for conciseness.

Referring to FIGS. 18 and 19, in the image sensor according to various embodiments, a first conductive layer connected to a landing pad may be omitted between the landing pad and a first substrate 110.

For example, a first through via 160 may contact a second wiring M2. That is, the second wiring M2 may be a landing pad. Here, a first conductive layer connected to the second wiring M2 may not be formed between the second wiring M2 and the first substrate 110. For example, as illustrated in FIG. 19, the first wiring M1 of FIG. 6 may be omitted.

Figure 20:
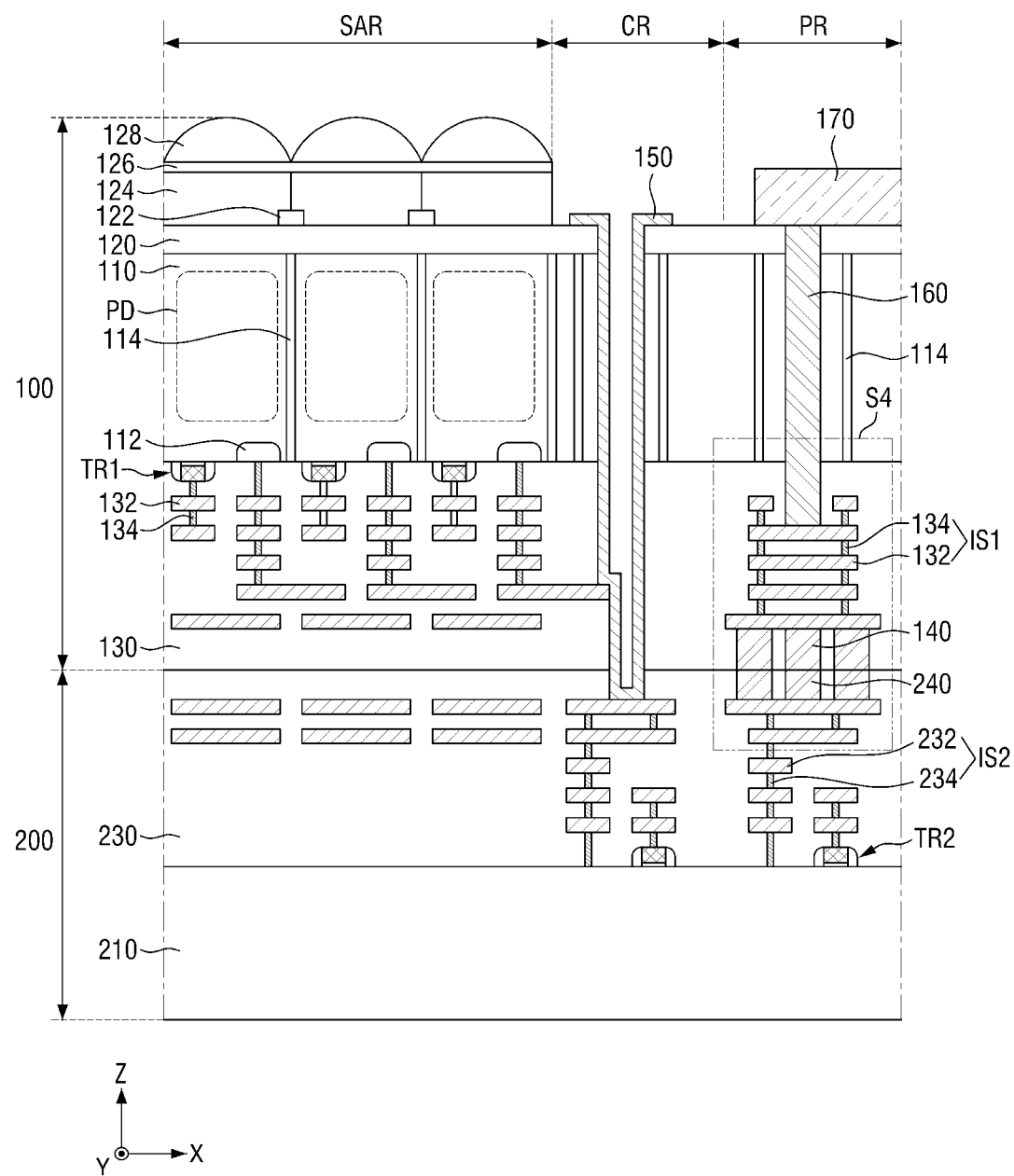
FIG. 20 is a schematic cross-sectional view of an image sensor according to embodiments.
Figure 21:
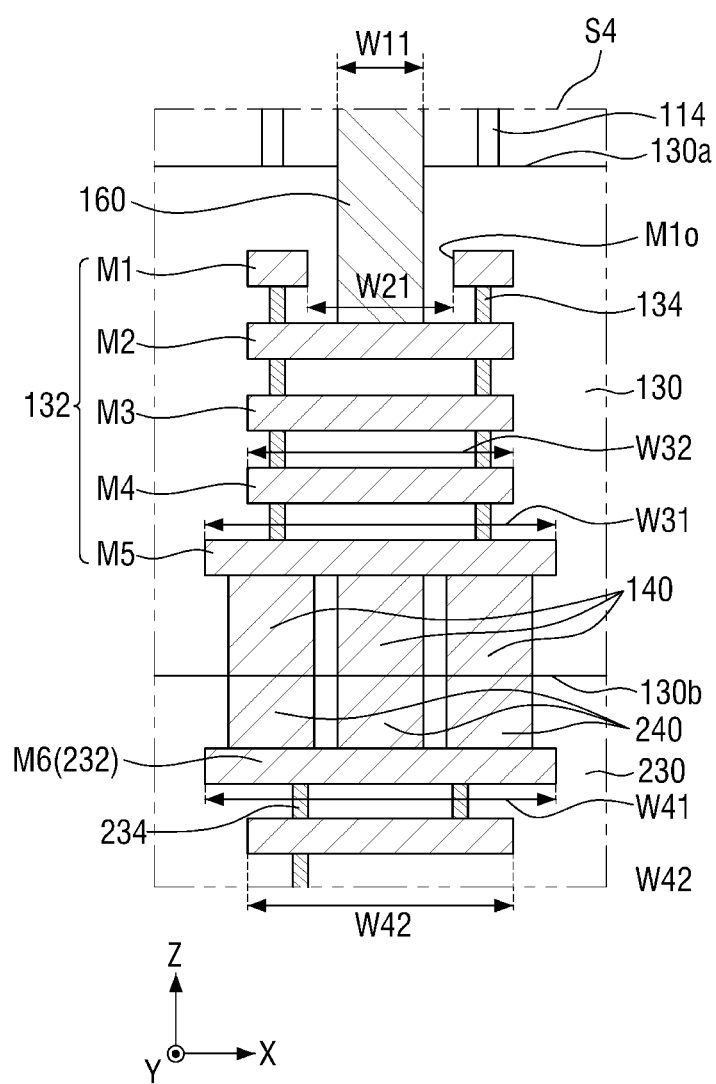
FIG. 21 is an enlarged view of a region S4 of the image sensor of FIG. 20.

FIG. 20 is a schematic cross-sectional view of an image sensor according to various embodiments. FIG. 21 is an enlarged view of region S4 of FIG. 20. For ease of description, a description of elements and features described above using FIGS. 1 through 9 will be given briefly or omitted for conciseness.

Referring to FIGS. 20 and 21, in the image sensor according to various embodiments, a conductive layer spaced farthest from a first substrate 110 among a plurality of first conductive layers 132 may be formed larger than other conductive layers.

For example, a fifth wiring M5 may be formed larger than first through fourth wirings M1 through M4. For example, as illustrated in FIG. 21, a width W31 of the fifth wiring M5 may be greater than a width W32 of the fourth wiring M4. Here, a width denotes a width in the first direction X (or the second direction Y).

In some embodiments, a plurality of connection patterns 140 may be connected to a first conductive layer 132. For example, the first connection patterns 140 spaced apart from each other may contact the fifth wiring M5.

In some embodiments, a conductive layer spaced farthest from a second substrate 210 among a plurality of second conductive layers 232 may be formed larger than other conductive layers. For example, a width W41 of a sixth wiring M6 may be greater than widths of other second conductive layers 232. In some embodiments, the width W41 may be the same the width W31. In other embodiments, the width W41 may be different than the width W31.

In some embodiments, a plurality of second connection patterns 240 may be connected to a second conductive layer 232. For example, the second connection patterns 240 spaced apart from each other may contact the sixth wiring M6.

The number and arrangement of the first connection patterns 140 and the second connection patterns 240 in FIGS. 20 and 21 are merely an example, and embodiments are not limited to this example.

Figure 22:
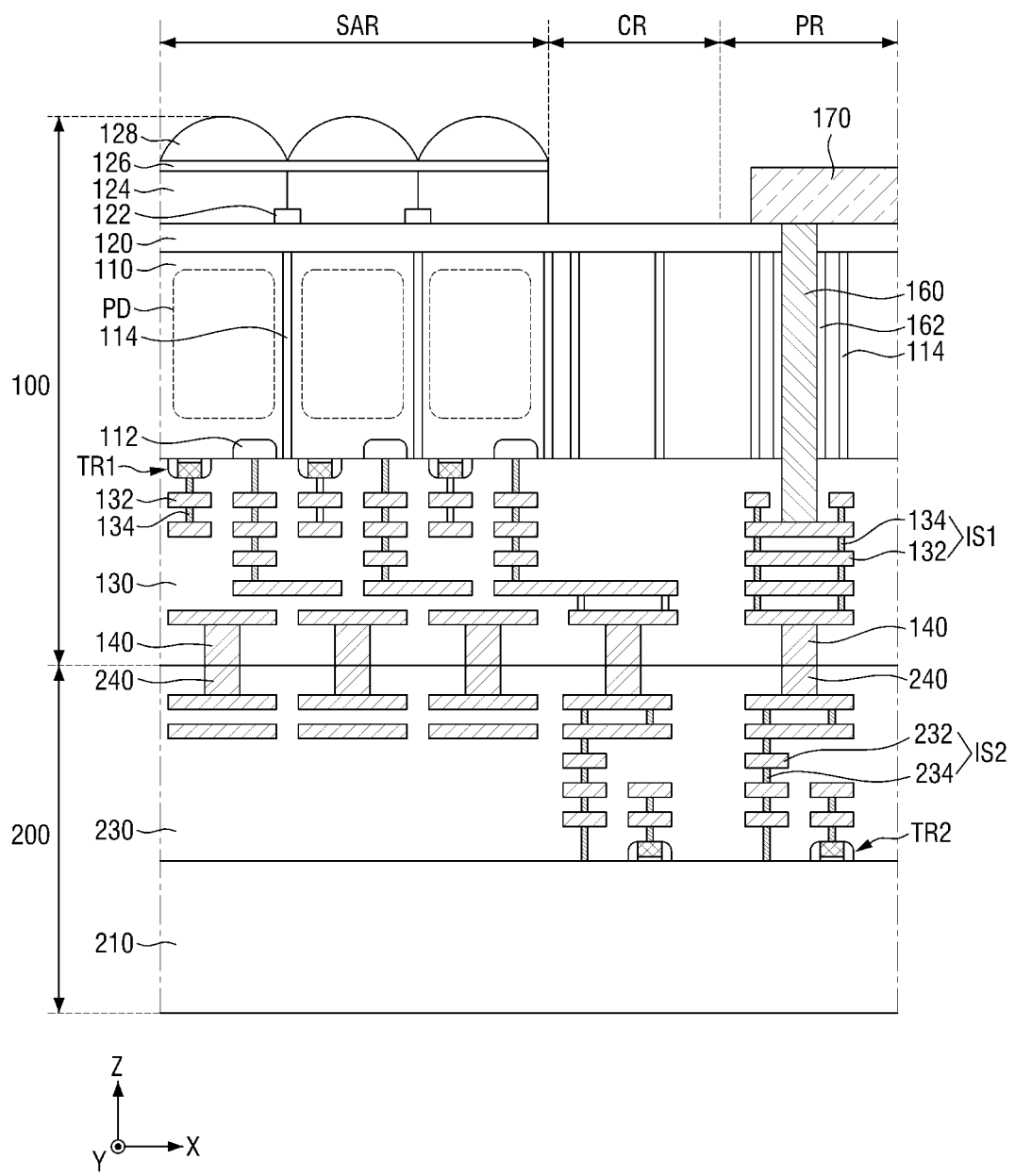
FIG. 22 is a schematic cross-sectional view of an image sensor according to embodiments.

FIG. 22 is a schematic cross-sectional view of an image sensor according to various embodiments. For ease of description, a description of elements and features described above using FIGS. 1 through 9 will be given briefly or omitted for conciseness.

Referring to FIG. 22, in the image sensor according to various embodiments, first connection patterns 140 and second connection patterns 240 connect a first wiring structure IS1 and a second wiring structure IS2 in a sensor array region SAR.

For example, at least some of the first connection patterns 140 may be formed in a first insulting structure 130 in the sensor array region SAR. In addition, at least some of the second connection patterns 240 may be connected to the first connection patterns 140 in the sensor array region SAR.

In some embodiments, the first connection patterns 140 and the second connection patterns 240 may also connect the first wiring structure IS1 and the second wiring structure IS2 in a connection region CR.

For example, at least some of the first connection patterns 140 may be formed in the first insulating structure 130 in the connection region CR. In addition, at least some of the second connection patterns 240 may be connected to the first connection patterns 140 in the connection region CR.

A method of fabricating an image sensor according to various embodiments will now be described with reference to FIGS. 23 through 27.

FIGS. 23 through 27 are views illustrating steps of a method of fabricating an image sensor according to various embodiments. For ease of description, a description of elements and features described above using FIGS. 1 through 9 will be given briefly or omitted for conciseness.

Figure 23:
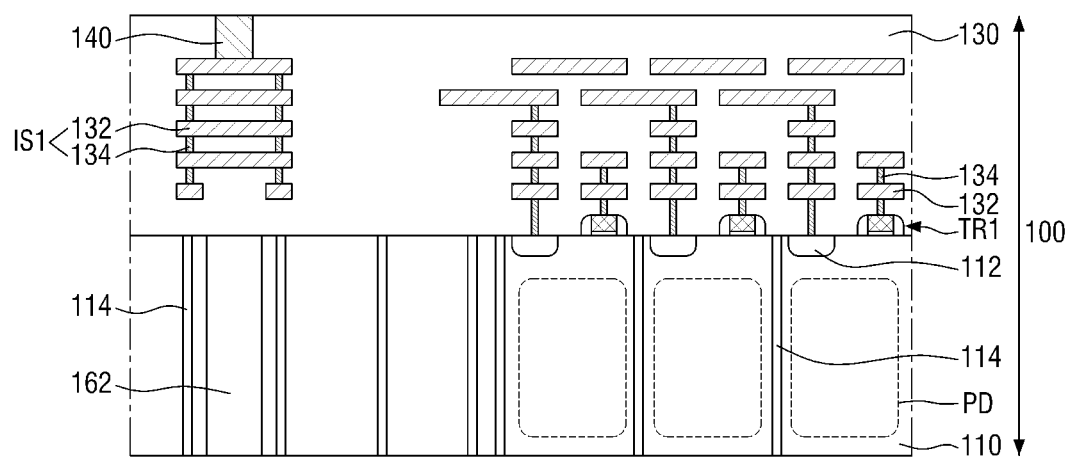
FIGS. 23 through 27 are views illustrating steps of a method of fabricating an image sensor according to embodiments.

Referring to FIG. 23, a first insulating structure 130 is formed on a first substrate 110. The first substrate 110 and the first insulating structure 130 may constitute a first stacked structure 100.

Photoelectric conversion layers PD, active regions 112, and first device isolation layers 114 may be formed in the first substrate 110. In addition, first transistors TR1 may be formed on the first substrate 110.

Then, the first insulating structure 130 may be formed on the first substrate 110. In some embodiments, the first insulating structure 130 may be formed on a front side (e.g., the second surface 110b of FIG. 4) of the first substrate 110.

A first wiring structure IS1 and a first connection pattern 140 may be formed in the first insulating structure 130. The first wiring structure IS1 may include a plurality of first conductive layers 132 and a plurality of first vias 134. The first connection pattern 140 may be connected to the first wiring structure IS1 and exposed from the first insulating structure 130.

Figure 24:
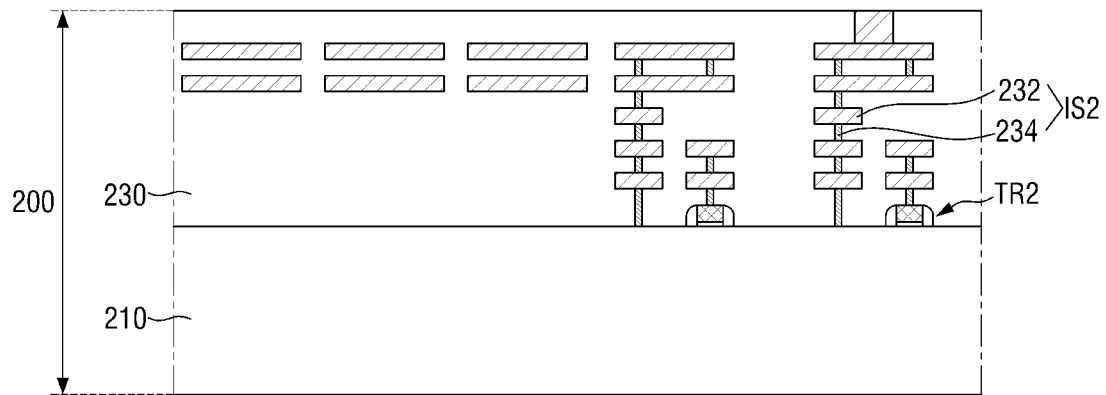

Referring to FIG. 24, a second insulating structure 230 may be formed on a second substrate 210. The second substrate 210 and the second insulating structure 230 may constitute a second stacked structure 200.

Second transistors TR2 may be formed on the second substrate 210.

Then, the second insulating structure 230 may be formed on the second substrate 210. A second wiring structure IS2 and a second connection pattern 240 may be formed in the second insulating structure 230. The second wiring structure IS2 may include a plurality of second conductive layers 232 and a plurality of second vias 234. The second connection pattern 240 may be connected to the second wiring structure IS2 and exposed from the second insulating structure 230.

Figure 25:
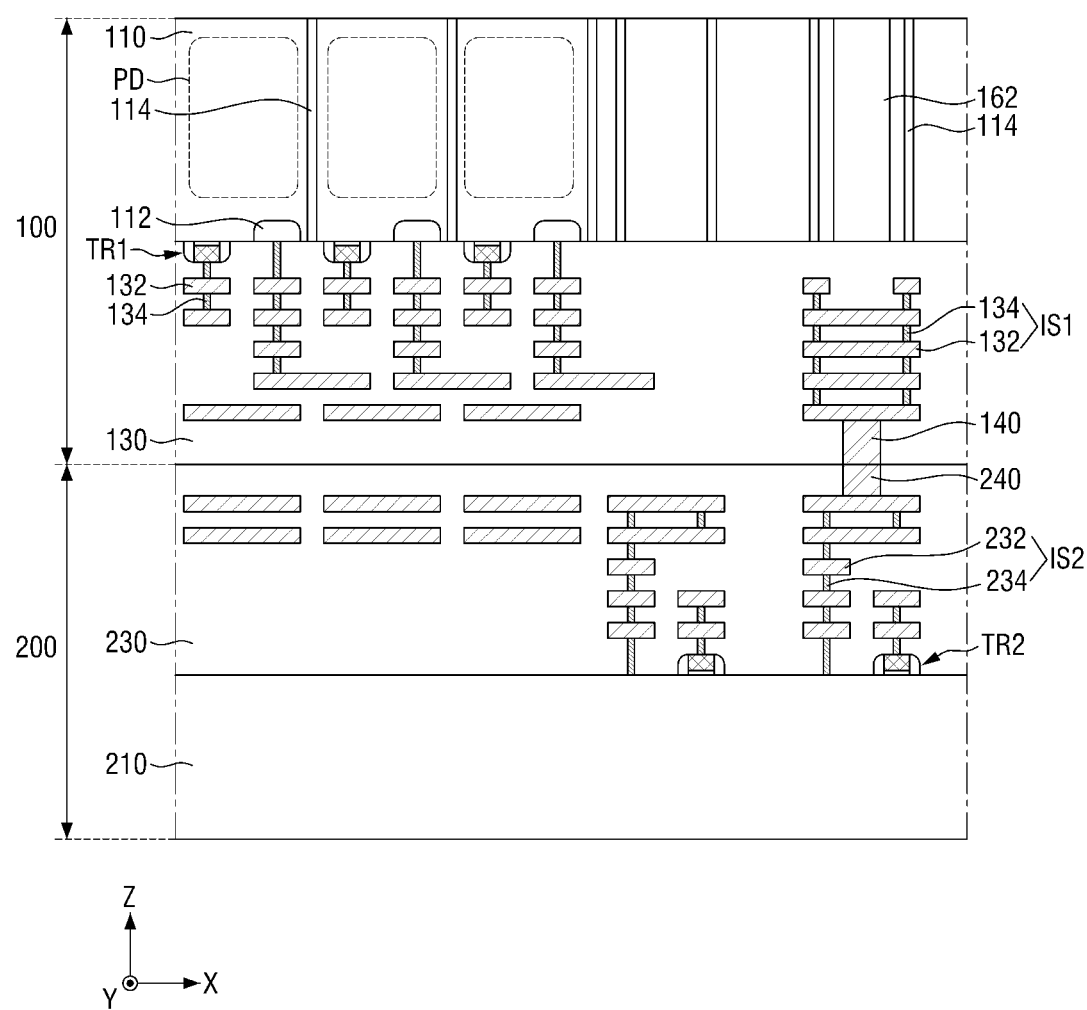

Referring to FIG. 25, the first insulating structure 130 and the second insulating structure 230 may be attached to each other.

For example, an upper surface of the first insulating structure 130 of FIG. 23 may be attached to an upper surface of the second insulating structure 230 of FIG. 24. In some embodiments, the first insulating structure 130 and the second insulating structure 230 may be attached by copper to copper bonding. Accordingly, the first connection pattern 140 exposed from the first insulating structure 130 and the second connection pattern 240 exposed from the second insulating structure 230 may be connected to each other. In addition, the first wiring structure IS1 and the second wiring structure IS2 may be electrically connected to each other.

Figure 26:
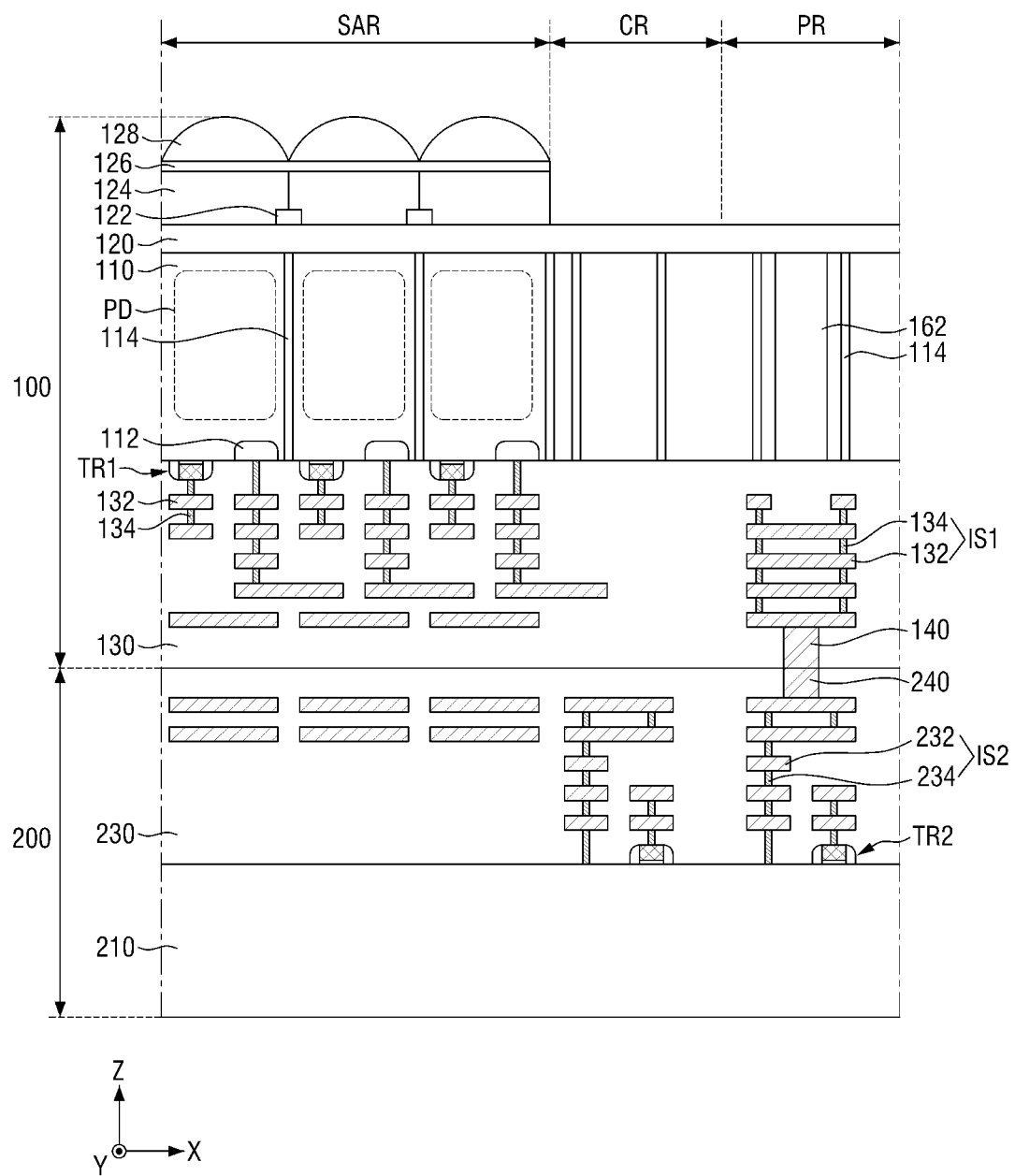

Referring to FIG. 26, a first planarization layer 120, color filters 124, grid patterns 122, a second planarization layer 126, and microlenses 128 may be sequentially formed on the first substrate 110.

In some embodiments, the first planarization layer 120, the color filters 124, the grid patterns 122, the second planarization layer 126, and the microlenses 128 may be formed on a back side (e.g., the first surface 110a of FIG. 4) of the first substrate 110.

Figure 27:
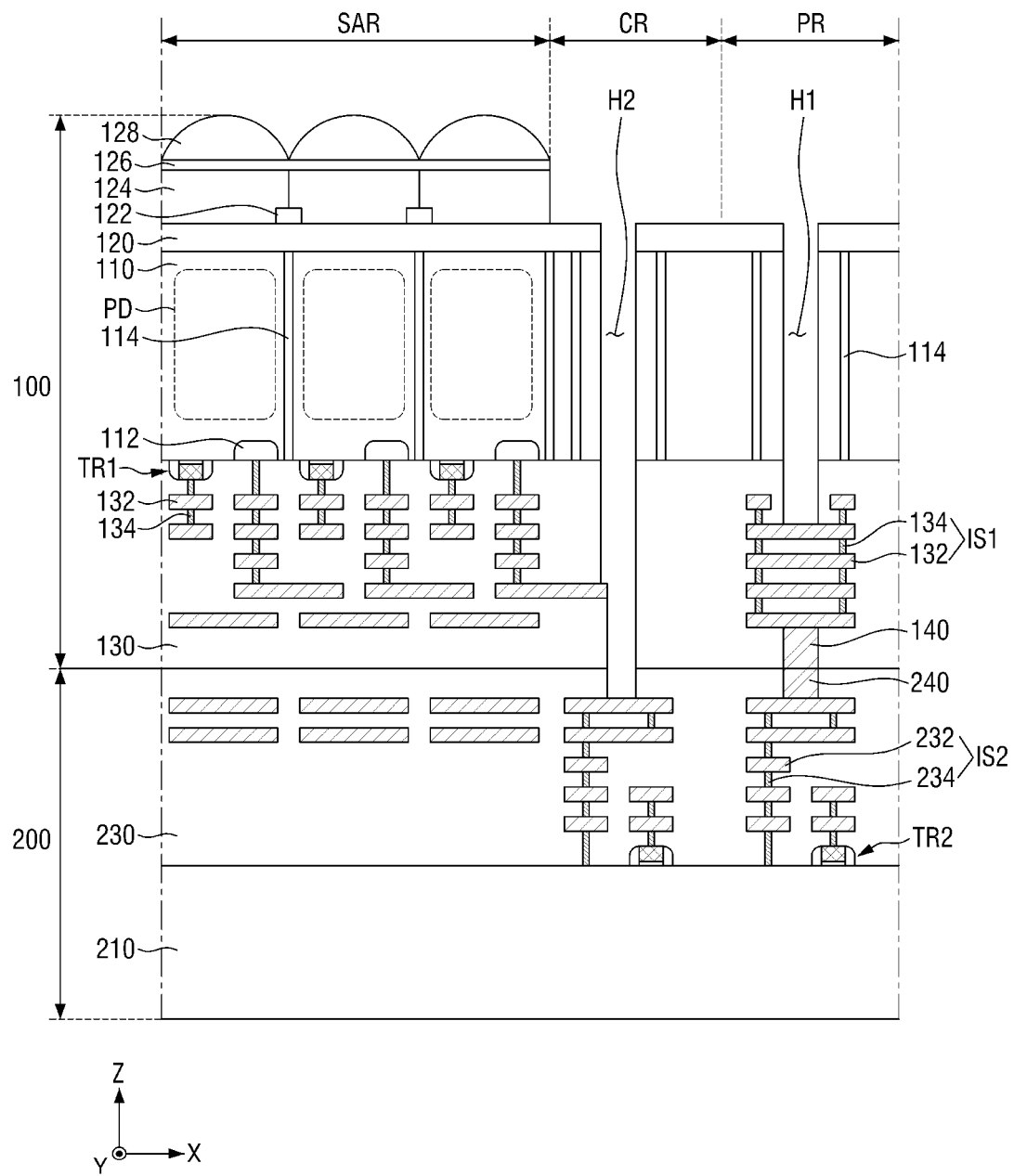

Referring to FIG. 27, a first hole H1 and a second hole H2 may be formed.

The first hole H1 may be formed in a pad region PR. The first hole H1 may pass through the first substrate 110 in the pad region PR. In some embodiments, the first hole H1 may expose a first conductive layer 132 in the pad region PR. In some embodiments, the first hole H1 may expose a conductive layer (e.g., the second wiring M2 of FIG. 6) farther from the first substrate 110 than a conductive layer (e.g., the first wiring M1 of FIG. 6) closest to the first substrate 110.

In some embodiments, the first hole H1 may be surrounded by a first device isolation layer 114 formed in the pad region PR.

The second hole H2 may be formed in a connection region CR. The second hole H2 may pass through the first substrate 110 in the connection region CR. In some embodiments, the second hole H2 may expose a first conductive layer 132 in the connection region CR and a second conductive layer 232 in the connection region CR.

In some embodiments, the second hole H2 may be formed at the same time as the first hole H1. Alternatively, the first hole H1 may be formed before or after the second hole H2 is formed.

Next, referring to FIG. 3, a first through via 160 and a second through via 150 are formed.

The first through via 160 may be formed to fill the first hole H1 of FIG. 27. Then, a conductive pad 170 may be formed on the first through via 160. Accordingly, the second wiring structure IS2 may be electrically connected to the conductive pad 170 in the pad region PR to transmit and receive electrical signals between the external device and the image sensor according to embodiments.

In some embodiments, the first through via 160 may be formed to completely fill the first hole H1 of FIG. 27. Alternatively, the first through via 160 may extend along the profile of the first hole H1 of FIG. 27.

The second through via 150 may be formed to fill the second hole H2 of FIG. 27. Accordingly, the second transistor TR2 may be electrically connected to a sensor array region SAR and may transmit and receive an electrical signal to and from each unit pixel of the sensor array region SAR.

In some embodiments, the second through via 150 may extend along the profile of the second hole H2 of FIG. 27. Alternatively, the second through via 150 may be formed to completely fill the second hole H2 of FIG. 27.

In concluding the detailed description, those skilled in the art will appreciate that many variations and modifications may be made to the various embodiments without substantially departing from the principles of the present inventive concept. Therefore, the disclosed various embodiments are used in a generic and descriptive sense only and not for purposes of limitation.

What is claimed is:

1. An image sensor comprising:
    a substrate which comprises a sensor array region and a pad region disposed around the sensor array region, and which comprises a first surface and a second surface opposite each other;
    a first insulating structure which is disposed on the second surface of the substrate and comprises a third surface facing the second surface and a fourth surface opposite the third surface;
    a first wiring structure which is formed in the first insulating structure and comprises a plurality of first conductive layers and a plurality of first vias;
    a through via which passes through the substrate in the pad region and is connected to the first wiring structure;
    a first connection pattern which is exposed from the fourth surface of the first insulating structure and is connected to the first wiring structure;
    a second insulating structure which is disposed on the fourth surface of the first insulating structure; and
    a second connection pattern which is exposed from a surface of the second insulating structure and is connected to the first connection pattern,
    wherein the plurality of first conductive layers comprise a first wiring, and a second wiring spaced farther from the substrate than the first wiring, and the through via contacts the second wiring.

2. The image sensor of claim 1, wherein the first wiring is a conductive layer closest to the substrate among the plurality of first conductive layers.

3. The image sensor of claim 1, wherein the second wiring contacts the first connection pattern.

4. The image sensor of claim 3, wherein the second wiring is a conductive layer farthest from the substrate among the plurality of first conductive layers.

5. The image sensor of claim 1, wherein the first wiring structure further comprises a third wiring spaced farther from the substrate than the second wiring, and the third wiring contacts the first connection pattern.

6. The image sensor of claim 5, wherein the third wiring is a conductive layer farthest from the substrate among the plurality of first conductive layers.

7. The image sensor of claim 5, wherein a width of the third wiring is greater than a width of the first wiring and a width of the second wiring.

8. The image sensor of claim 1, further comprising a conductive pad which is disposed on the first surface of the substrate in the pad region and is connected to the through via.

9. The image sensor of claim 1, wherein the first wiring surrounds the through via in plan view.

10. An image sensor comprising:
a substrate which comprises a photoelectric conversion layer, a first surface on which light is incident, and a second surface opposite the first surface;
a conductive pad which is disposed on the first surface of the substrate;
a first insulating structure which is disposed on the second surface of the substrate and which comprises a third surface facing the second surface, and a fourth surface opposite the third surface;
a first wiring which is formed in the first insulating structure and which comprises a first opening;
a second wiring which is formed in the first insulating structure and is spaced farther from the substrate than the first wiring;
a through via which passes through the substrate and the first opening to connect the conductive pad to the second wiring;
a first connection pattern which is exposed from the fourth surface of the first insulating structure and is connected to the second wiring;
a second insulating structure which is disposed on the fourth surface of the first insulating structure; and
a second connection pattern which is exposed from a surface of the second insulating structure and is connected to the first connection pattern.

11. The image sensor of claim 10, wherein a width of the through via is smaller than a width of the first opening.

12. The image sensor of claim 10, wherein a first width of the through via passing through the substrate is greater than the width of the first opening, and a second width of the through via passing through the first opening is equal to the width of the first opening.

13. The image sensor of claim 12, wherein the through via contacts both the first wiring and the second wiring.

14. The image sensor of claim 10, wherein the second wiring comprises a second opening, and the through via contacts at least a part of the second wiring.

15. The image sensor of claim 14, wherein the second opening does not overlap the through via in plan view.

16. The image sensor of claim 14, wherein at least a part of the second opening overlaps the through via in plan view.

17. An image sensor comprising:
a first substrate which comprises a sensor array region and a pad region disposed around the sensor array region, and which comprises a first surface on which light is incident and a second surface opposite the first surface;
a color filter which is disposed on the first surface of the first substrate in the sensor array region;
a microlens which is disposed on the color filter;
a conductive pad which is disposed on the first surface of the first substrate in the pad region;
a first insulating structure which is disposed on the second surface of the first substrate, and which comprises a third surface facing the second surface, and a fourth surface opposite the third surface;
a first wiring structure which is formed in the first insulating structure and which comprises a plurality of first conductive layers and a plurality of first vias, the plurality of first conductive layers including a first wiring;
a first through via which passes through the first substrate in the pad region to connect the conductive pad and the first wiring structure;
a first connection pattern which is exposed from the fourth surface of the first insulating structure and is connected to the first wiring structure;
a second insulating structure which is disposed on the fourth surface of the first insulating structure;
a second wiring structure which is formed in the second insulating structure and which comprises a plurality of second conductive layers and a plurality of second vias; and
a second connection pattern which is exposed from a surface of the second insulating structure and which connects the first connection pattern and the second wiring structure,
wherein the first through via does not contact the first wiring which is closest to the first substrate among the plurality of first conductive layers.

18. The image sensor of claim 17, wherein the plurality of first conductive layers further comprise a second wiring which is spaced farther from the first substrate than the first wiring, and the first through via contacts the second wiring.

19. The image sensor of claim 17, further comprising a second substrate which is disposed on the second insulating structure, wherein the second wiring structure connects the second connection pattern and the second substrate.

20. The image sensor of claim 19, wherein the first substrate further comprises a connection region disposed around the sensor array region, and the image sensor further comprises a second through via which passes through the first substrate in the connection region to connect the first wiring structure and the second wiring structure.

* * * * *